(12) United States Patent
Kaufman

(10) Patent No.: US 7,381,953 B1
(45) Date of Patent: Jun. 3, 2008

(54) INFRARED IMAGING DEVICE

(75) Inventor: Peter Kaufman, Fresh Meadows, NY (US)

(73) Assignee: Public Service Solutions, Inc., Fresh Meadows, NY (US)

( * ) Notice: Subject to any disclaimer, the term of this patent is extended or adjusted under 35 U.S.C. 154(b) by 296 days.

(21) Appl. No.: 10/899,589

(22) Filed: Jul. 26, 2004

Related U.S. Application Data

(60) Provisional application No. 60/490,289, filed on Jul. 25, 2003.

(51) Int. Cl.
*H01L 25/00* (2006.01)
(52) U.S. Cl. ...................................... 250/332; 250/334
(58) Field of Classification Search ................ 250/332, 250/334
See application file for complete search history.

(56) References Cited

U.S. PATENT DOCUMENTS

| | | | |
|---|---|---|---|
| 4,032,783 A | | 6/1977 | Koda |
| 4,214,165 A | * | 7/1980 | Asawa ..................... 250/338.3 |
| 4,818,724 A | * | 4/1989 | Cetronio et al. ............ 438/606 |
| 5,036,197 A | * | 7/1991 | Voles .......................... 250/332 |
| 5,710,428 A | * | 1/1998 | Ko .............................. 250/332 |
| 6,122,042 A | * | 9/2000 | Wunderman et al. ......... 356/73 |
| 6,429,719 B1 | * | 8/2002 | Nakatsuka ................... 327/344 |

* cited by examiner

*Primary Examiner*—Christine Sung
(74) *Attorney, Agent, or Firm*—Keusey, Tutunjian & Bitetto, P.C.

(57) ABSTRACT

A room temperature infrared imager, fabricated using MEMS (Micro Electro Mechanical Systems) techniques, made up of individually functioning analog elements laid out in a horizontal and vertical block matrix (pixel array). The front of each individual pixel element is IR sensitive and varies its properties in proportion to the corresponding analog level of incident IR energy exposure. An image infrared energy is focused across the front of the array to ultimately create a visible light image. The detector elements are formed on the front of a substrate. On the rear of the substrate, right behind the detectors, are electronics which read the sensors exposure level. Formed on top of the electronics are Light Emitting Devices (LED's). The electronics vary the brightness of the LED's proportionally with the exposure level on the front of the detector. The image is formed by the different visible light levels that appear on the array readout.

14 Claims, 26 Drawing Sheets

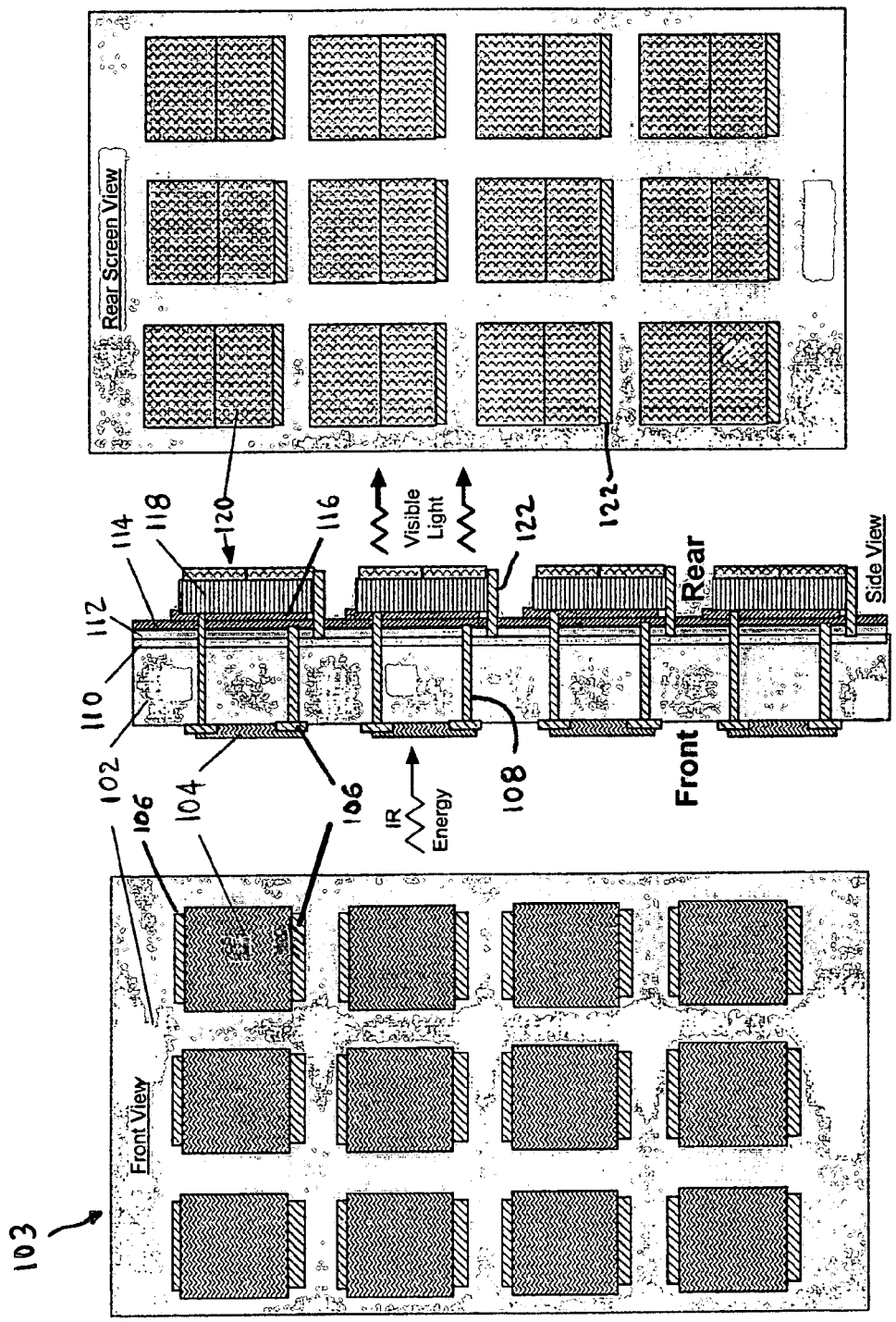

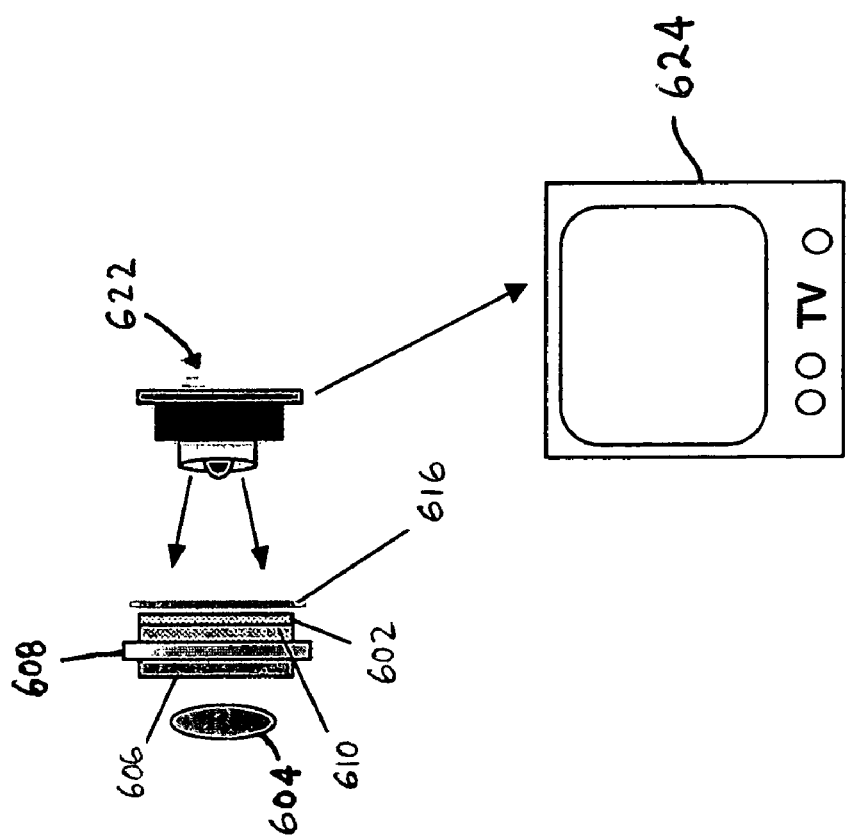
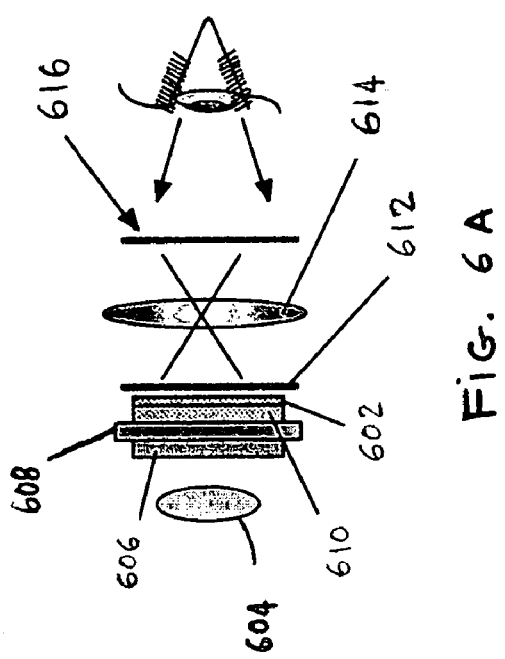
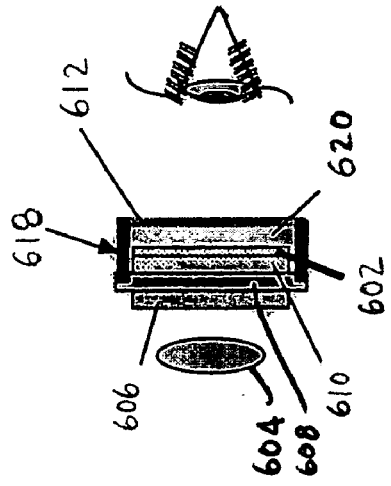

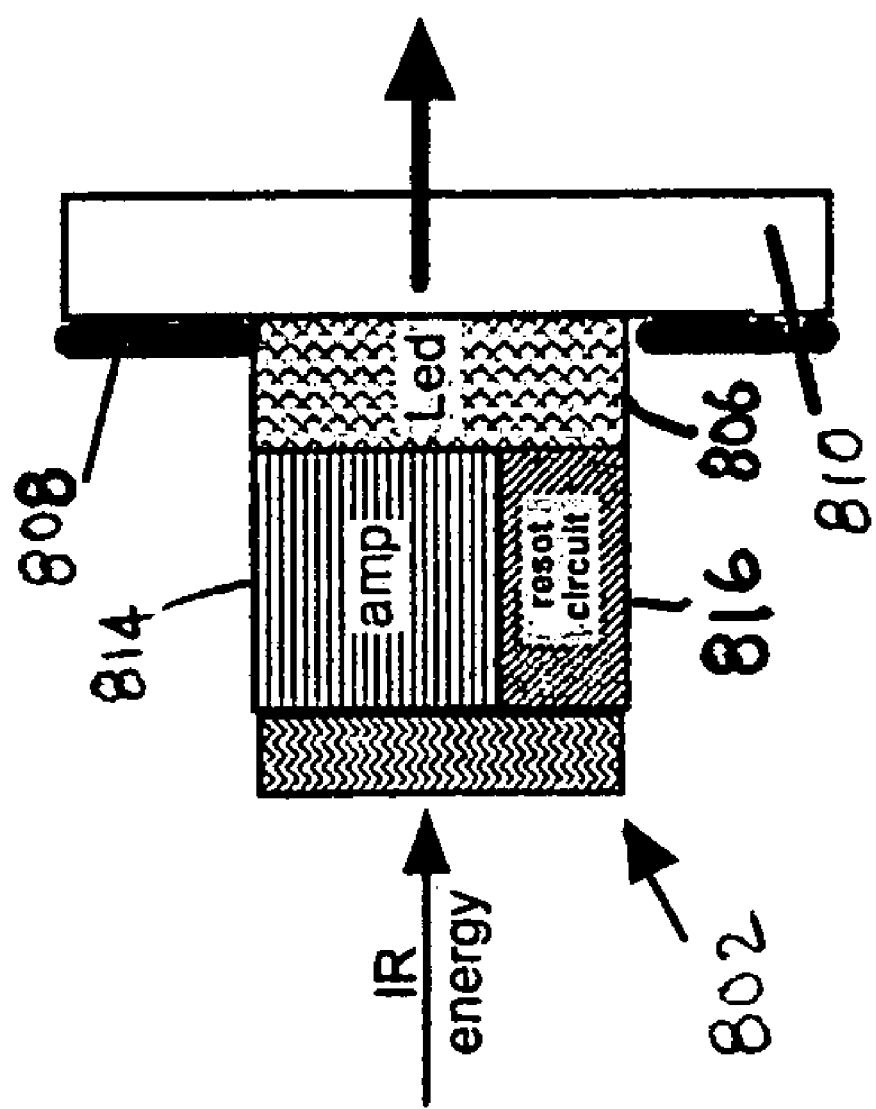

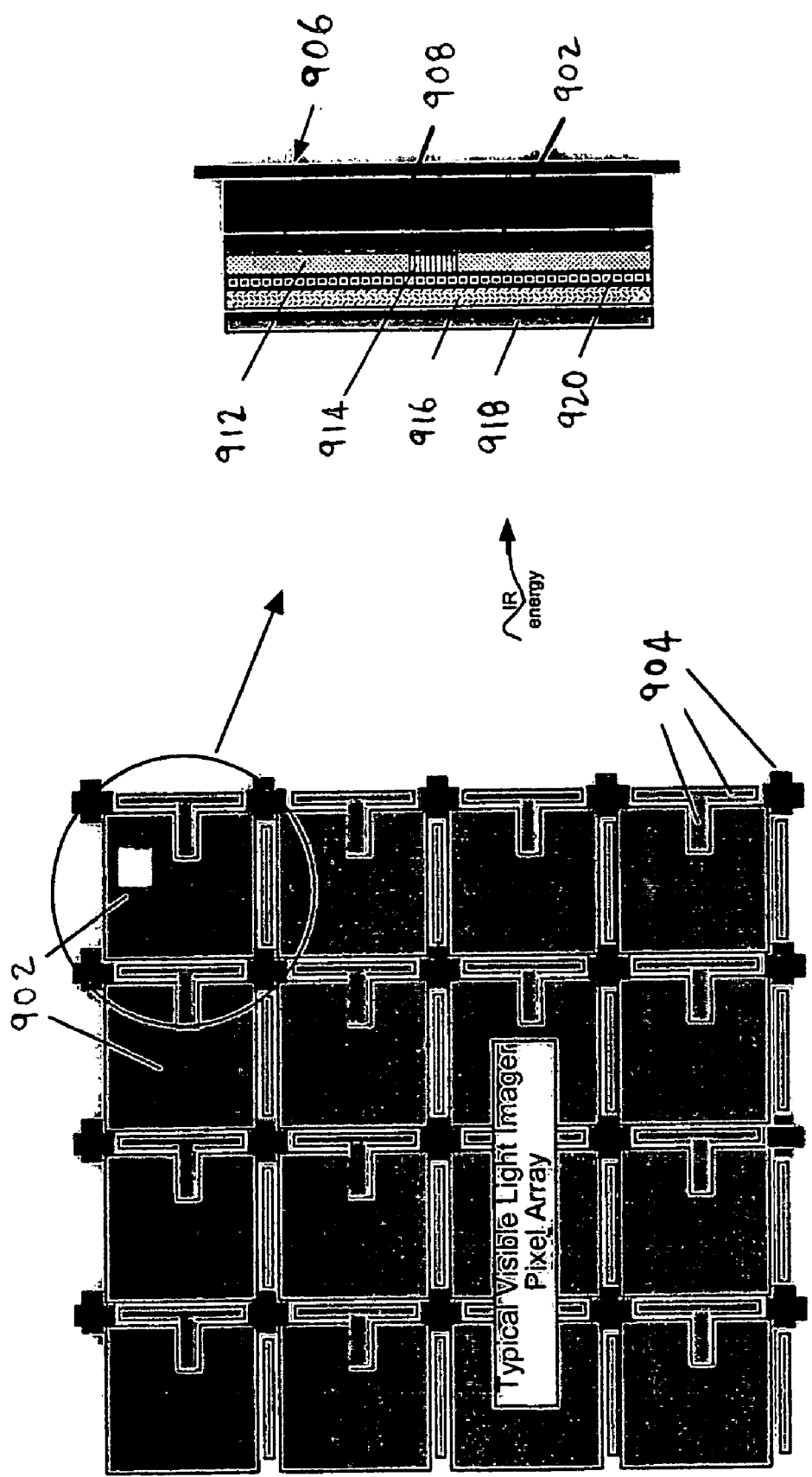

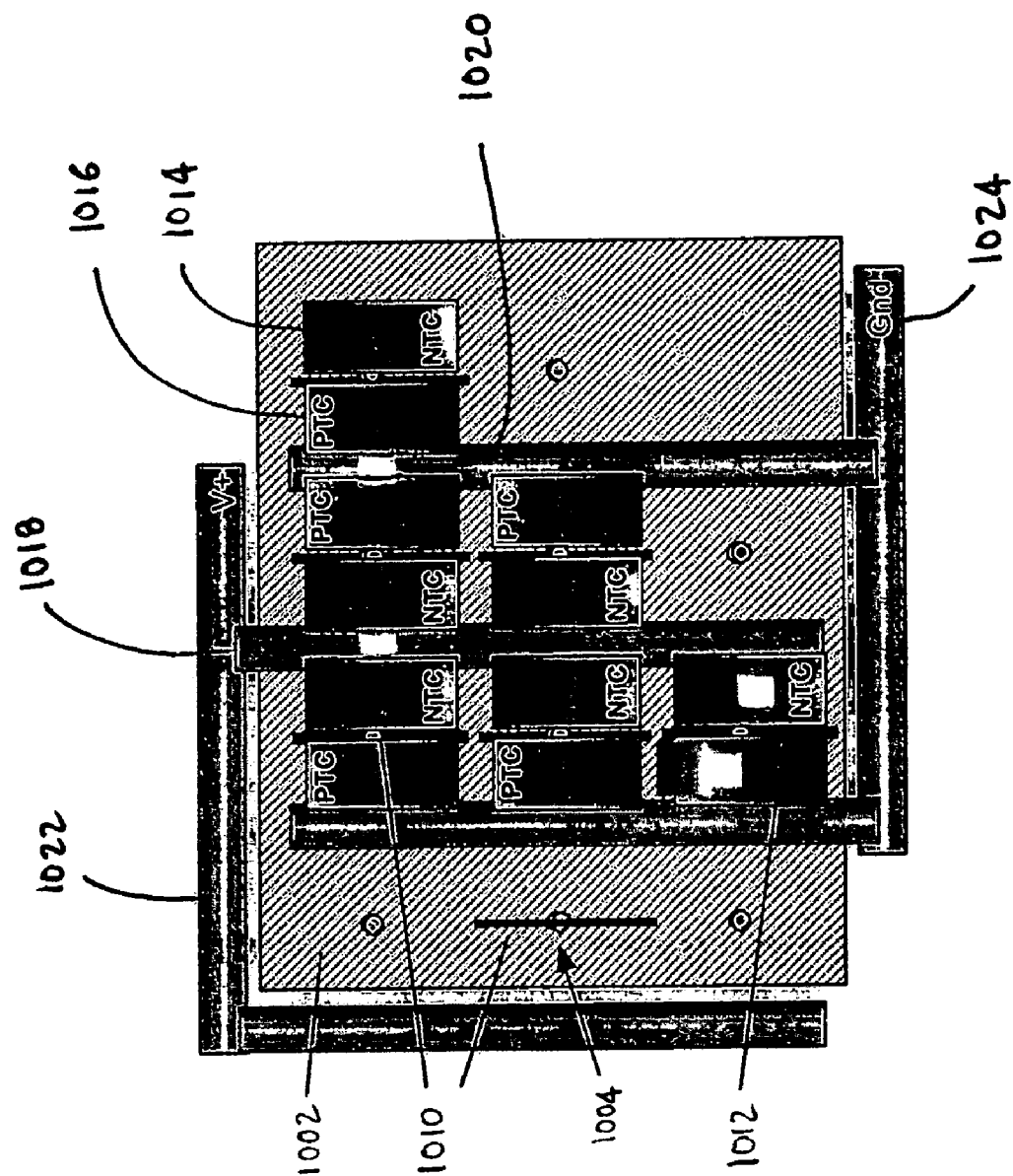

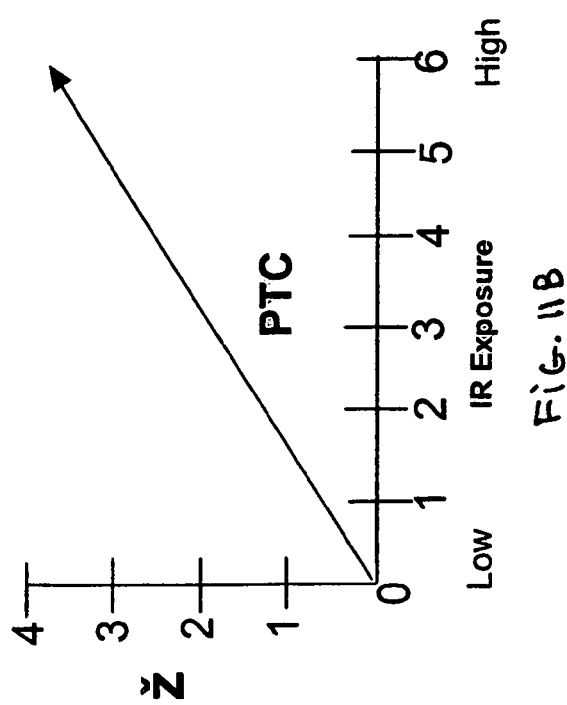
|  | Dark | Light |
|---|---|---|
| NTC-z | Hi-z | Lo-z |
| PTC-z | Lo-z | Hi-z |
| $V_{in}$ | Lo-V | Hi-V |
FIG. 11C
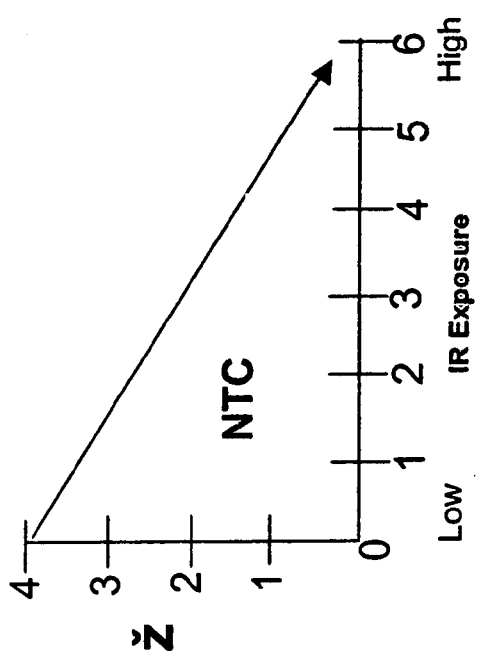
FIG. 11A
FIG. 11B

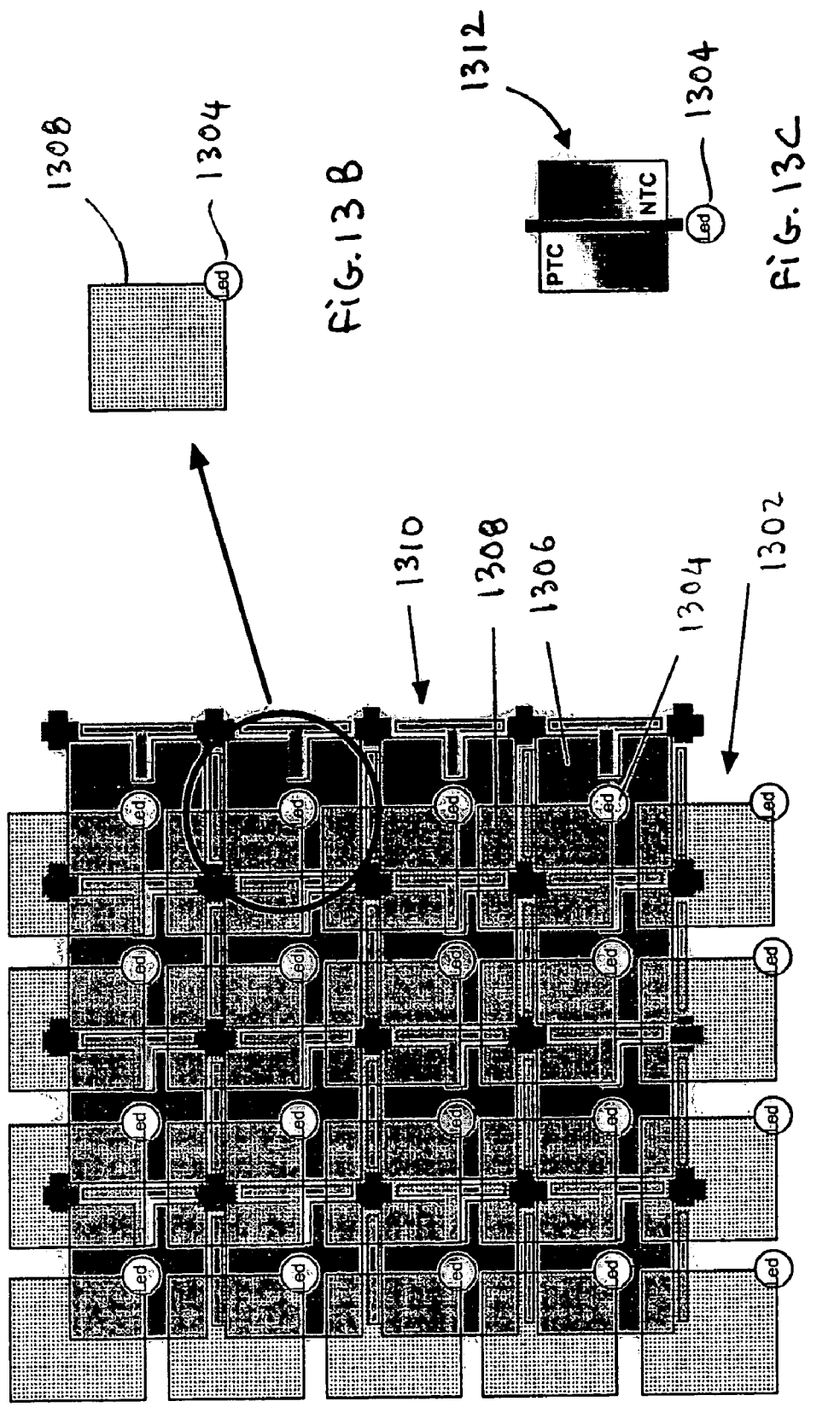

INFRARED IMAGING DEVICE

CROSS-REFERENCE TO RELATED APPLICATIONS

This application claims the benefit of U.S. Provisional Application No. 60/490,289, filed Jul. 25, 2003.

FIELD OF THE INVENTION

The present invention relates to imaging devices. More particularly, the present invention relates to infrared thermal imaging devices and thermal imaging sensors and detectors.

BACKGROUND OF THE INVENTION

Security and safety issues capture front-page coverage every day and have a growing impact on the US economy and quality of life. The average US citizen is seriously concerned about his family's risk of exposure to accidents, crime and acts against society.

Infrared (IR) thermal imaging systems have been proliferating in commercial, but mostly industrial and military products. These devices have become less expensive over the last several years but are still too expensive to become mainstream products for widespread consumer use. The need for consumer-priced infrared thermal imaging equipment has never been more pressing. Thermal imaging used on a wide scale allows the US to get a technological edge against those who wish to harm the US.

However, budgetary considerations have created the need for a new generation of Thermal Imaging Sensors. These sensors need to be priced in the commercial rather than scientific or military realm while maintaining the performance of scientific and military devices.

A typical thermal sensor unit (for instance, ¼ VGA) has 320 by 240 resolution=76,800 pixels. These sensor cores cost about $3,000 to $4,000 in lots of 1,000 units. The comparative common denominator is cost per pixel. Using the above example, the cost per pixel is $0.04 per pixel ($3,000/76,800). For true proliferation into consumer markets, the cost per pixel should cost no more than 50¢ per pixel. At that price an imager core (320×240) would cost less than $400 which would be a reasonable base price for consumer products retailing between $1,000 to $2,500. This would amount to ⅒th of what these devices are currently sell for.

The last 40 years have seen the development of many different types of thermal sensors. There are basically two types of detectors: quantum and thermal. In quantum detectors, incoming photons are collected while in thermal detectors, incoming photons are converted to heat which changes some measurable characteristic of the sensor material like resistance or capacitance. Quantum detectors are better but are more difficult to manufacture. However, thermal detectors operate better in the mid to far IR wavelengths of 3 to 14 microns. Furthermore, thermal detector materials operate better at room temperature and do not need active cooling.

Uncooled sensors have received much attention by design engineers as they are smaller, lighter, use less power and cost less. Currently most are bolometers, pyroelectric or thermoelectric. A need therefore exists for a detector that is thermally and electrically isolated from its surroundings and insulated from outside noise sources. Conventional video signal systems create electronic noise from the readout and scanning circuitry.

Thus, a need exists for a low cost thermal imaging device. In particular, a need exists for an efficient method for building a low cost thermal imaging device. A primary purpose of the present invention is to solve these needs and provide further, related advantages.

BRIEF DESCRIPTION OF THE INVENTION

A room temperature infrared imager, fabricated using MEMS (Micro Electro Mechanical Systems) techniques, made up of individually functioning analog elements laid out in a horizontal and vertical block matrix (pixel array). The front of each individual pixel element is IR sensitive and varies its properties in proportion to the corresponding analog level of incident IR energy exposure. An image infrared energy is focused across the front of the array to ultimately create a visible light image. The detector elements are formed on the front of a substrate. On the rear of the substrate, right behind the detectors, are electronics which read the sensors exposure level. Formed on top of the electronics are Light Emitting Devices (LED's). The electronics vary the brightness of the LED's proportionally with the exposure level on the front of the detector. The image is formed by the different visible light levels that appear on the array readout. The display needs to be periodically updated as the IR exposure level of the original image changes in real time. Located with the amplifier is a reset element that sets the sensor level back to its null level. The detector then accumulates a charge based on a new exposure level and update the readouts display image. The array can stare by inhibiting reset to accumulate IR energy in low exposure level conditions. This allows detection of weak or distant IR emitters. The sensors can be collectively reset to create a variable frame rate.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1A is a diagram schematically illustrating a front view of an infrared detector in accordance with one embodiment of the present invention.

FIG. 1B is a diagram schematically illustrating a side view of an infrared detector in accordance with one embodiment of the present invention.

FIG. 1C is a diagram schematically illustrating a rear view of an infrared detector in accordance with one embodiment of the present invention.

FIG. 6A is a diagram schematically illustrating a direct view image method for viewing the readout image of an infrared detector in accordance with one embodiment of the present invention.

FIG. 6B is a diagram schematically illustrating a phosphor readout screen method for viewing the readout image of an infrared detector in accordance with one embodiment of the present invention.

FIG. 6C is a diagram schematically illustrating a video signal system method for viewing the readout image of an infrared detector in accordance with one embodiment of the present invention.

FIG. 8C is a block diagram schematically illustrating a side view of one infrared element of the detector shown in FIG. 8B.

FIG. 9A is a diagram illustrating a front view of an infrared detector having a photo-sensitive semiconductor in accordance with another embodiment of the present invention.

FIG. 9B is a diagram illustrating a side view of the infrared detector shown in FIG. 9A.

FIG. 10B is a diagram illustrating a cell of the infrared detector shown in FIG. 10A.

FIG. 11A is a graph illustrating the impedance of an NTC thermistor used in the infrared detector of FIG. 10A.

FIG. 11B is a graph illustrating the impedance of a PTC thermistor used in the infrared detector of FIG. 10A.

FIG. 11C is a comparison table illustrating the relationship between the thermistors used in the infrared detector shown in FIG. 10A.

FIG. 13A is a diagram illustrating an infrared detector with LEDs deposited on top of the infrared detector in accordance with another embodiment of the present invention.

FIG. 13B is a diagram illustrating an LED deposited on a detector cell of the infrared detector of FIG. 13A.

FIG. 13C is a diagram illustrating an LED deposited on a detector using dual thermistors in accordance with an alternative embodiment.

DETAILED DESCRIPTION

Figure 1D:
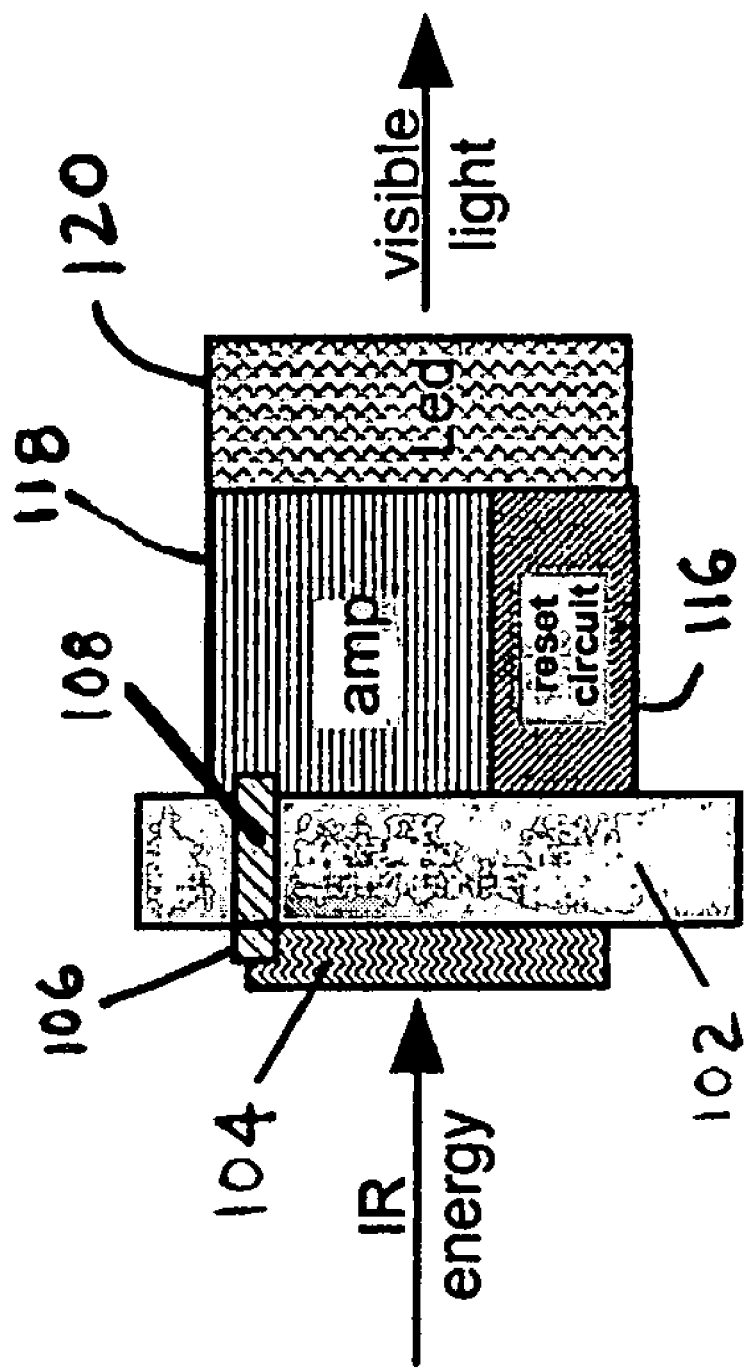
FIG. 1D is a block diagram schematically illustrating a side view of one infrared element of the detector shown in FIG. 1B.

Embodiments of the present invention are described herein in the context of an infrared detector. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FP-GAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Description of Operation

In accordance with one embodiment of the present invention, an analog real-time infrared detector-transducer array on a single substrate converts infrared (IR) energy to a proportional amount of visible light to the human eye thereby creating a directly viewable image on the array readout. The IR incident image photons enter the front of the device and a visible light representation of the IR image is displayed on the rear readout as a viewable image on the pixel array of light emitters (LEDs) that corresponds to the detectors on the front of the device.

The IR incident photons enter the front of the device via an aperture or lens. The aperture or lens projects the focused image on an array of sensors laid out in a planar horizontal and vertical array of pixels. The individual pixels sensor material may be reactive to photons or electromagnetic energy in the IR, Visible, UV or X-Ray spectrum of 30 to 0.00001 microns. However, the primary focus of the present invention is in the IR thermal bandwidth of about 3 to 14 microns. The IR sensitive material may be made from (Lithium Niobate—LiNbO3) which is a piezo-pyroelectric material. Those of ordinary skills in the art will recognize that other materials may also be suitably used as IR sensitive material. As the IR incident energy from the IR photons heats the IR sensitive material, a voltage charge builds up. This voltage charge is converted into a proportional amount of current to drive the pixel light emitting device (LEDs) to form a visible light image in the rear. An Op-Amp circuit block may be used to implement this function. Each pixel element has a reset transistor whose purpose is to discharge the voltage on the detector element. This is the functional equivalent of the dark cycle of a photo chopper. It brings the detector voltage to zero so the detection cycle can start over again. The control gates of all the transistors are connected together so the complete array can be reset at the same time.

Detector Orientation and Readout Diagrams (FIGS. 1A, 1B, 1C, 1D)

FIG. 1A illustrate a front view of one embodiment of an infrared detector system. With respect to FIG. 1A, the base of the system is the substrate 102. The substrate 102 holds all the structures of the system. FIG. 1A shows the front of the sensor array 103 and the detector pixels 104. The pixels 104 are deposited on the substrate 102. Each square is 1 pixel detector element 104 and is an infrared (IR) sensitive material. Contact pads 106 disposed on opposite ends of each pixel 104. These contact pads 106 make the connection between the detector 104 and the back of the substrate 102 where the pixels circuitry resides. The substrate 102 has holes under each contact pad 106. Each hole includes a via 108 connecting each contact pad 106 to the back of the substrate 102.

FIG. 1B illustrates a cross-sectional view of the array detector in relation to the substrate 102 that holds all the system components. In this diagram, the IR energy from IR photons enter from left to right and strike the detector 104 surface on the front. The vias 108 go thru the substrate connecting the detector 104 to the circuitry at the rear of the substrate 102. The circuitry at the rear includes a ground layer 110, an insulation layer 112 on top of the ground layer 110, a reset plane 114 on top of the insulation layer 112, a reset switch 116 on top of the reset plane 114, an amplifying circuit 118 on top of the reset switch 116, and an LED 120 on top of the amplifying circuit 118. A vertical member 122 supports the circuitry on the back of the substrate 102. Each element is described in more detailed in FIG. 1D.

FIG. 1C illustrates the rear of the substrate 102 with the orientation of each pixels LED 120. The LED's 120 are directly behind their corresponding detectors in the front of the substrate 102.

FIG. 1D illustrates a block diagram of a cross-sectional view of a pixel from the detector in FIG. 1B. To reiterate, the IR photons enter from the right and strike the IR detector 104 made up of an IR sensitive material. The detector 104 changes properties based on the amount of incident IR photons on the detector 104. For example, the focused IR energy may cause the detector 104 to change its resistance based on the amount of incident photons at the detector 104. Or in the case of a piezo-pyroelectric material (PPM), the detector 104 forms a voltage corresponding to the amount of photons received at the detector 104.

The amplifying circuit 118 is coupled to the detector via contact pad 106 and via 108. The amplifying circuit 118 varies the LED 120 drive current which varies the brightness of the LED 120. The LED may display at least 128 shares of gray between black and white. The LED 120 produces a visible light to the human eye at the rear of the array 103. The detector 104 is isolated from the heat generated by the LED using the insulative properties of the substrate and insulation layer 112. Therefore, in accordance with one embodiment of the present invention, the circuitry of one element (one pixel) on the rear of the substrate 102 includes an amplifying circuit 118, a reset circuit 116, and an LED 120.

In the case of a PPM sensor material 104, the PPM sensor can have the charge that forms on it from the IR exposure reset and discharged by shorting the sensor to ground with the reset switch 116.

The display may be periodically updated as the IR exposure level of the original image changes in real time. Located with the amplifier is the reset element 116 that sets the sensor level back to its null level. The detector then accumulates a charge based on a new exposure level and update the readouts display image.

The array can stare by inhibiting reset to accumulate IR energy in low exposure level conditions. This allows detection of weak or distant IR emitters. The sensors can be collectively reset to create a variable frame rate.

Figure 2:
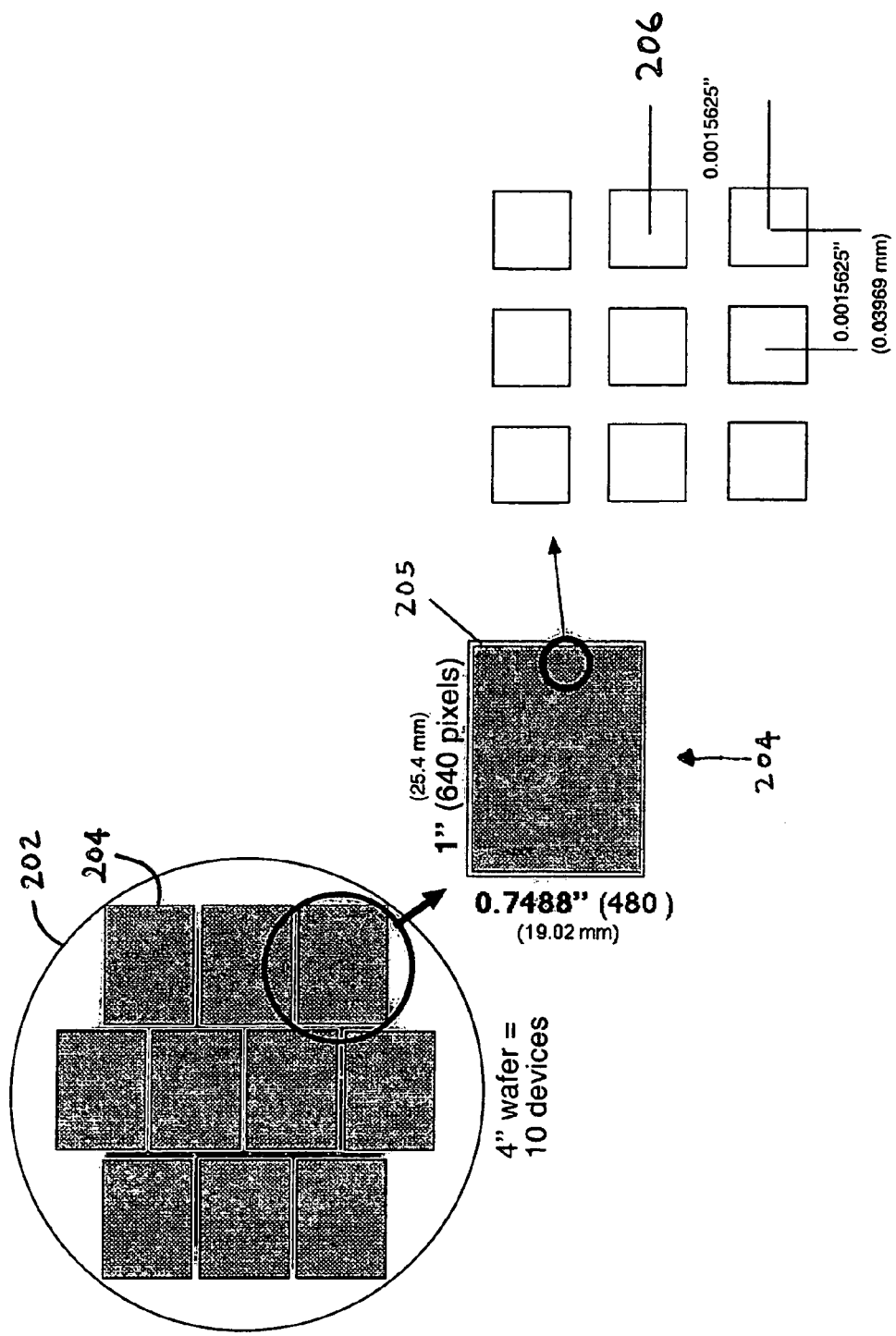
FIG. 2 is a diagram schematically illustrating a manufacturing technique using wafers for the fabrication of infrared detectors in accordance with one embodiment of the present invention.

Imager on 6" Wafer, Dimensions and Pixel Spacing (FIG. 2)

With respect to FIG. 2, the devices are manufactured using MEMS manufacturing foundry technology and techniques. The device layers are deposited on a 4" or 6" wafer and are machined using MEMS techniques of etching, laser cutting, dissolving release layers, silk screening etc. FIG. 2 illustrates a 4" wafer 202 yielding about 10 devices 204. For illustration purposes, the devices architecture measurements may be as follows with a 4" wafer: VGA pixel format of 640 by 480. Pixel spacing center to center is 0.00015625" (0.03969 mm) horizontal and vertical. Given these measurements, the device active surface 204 measures 1" (25.4 mm) horizontal and 0.7488" (19.02 mm) vertical. A boarder 205 is left around the outer edge of the active device 104 to allow for connections. With the VGA dimensions, about 10 complete device 204 arrays can be assembled on a 4" wafer 202. The wafer 202 is then sliced up to produce the individual imager devices 204. FIG. 2 also illustrates a magnified view of an individual device 204 with a few of the pixels 206 of an array with the spacing and orientation. Those of ordinary skills in the art will recognize that a larger diameter wafer will yield more individual devices 204.

Figure 3A:
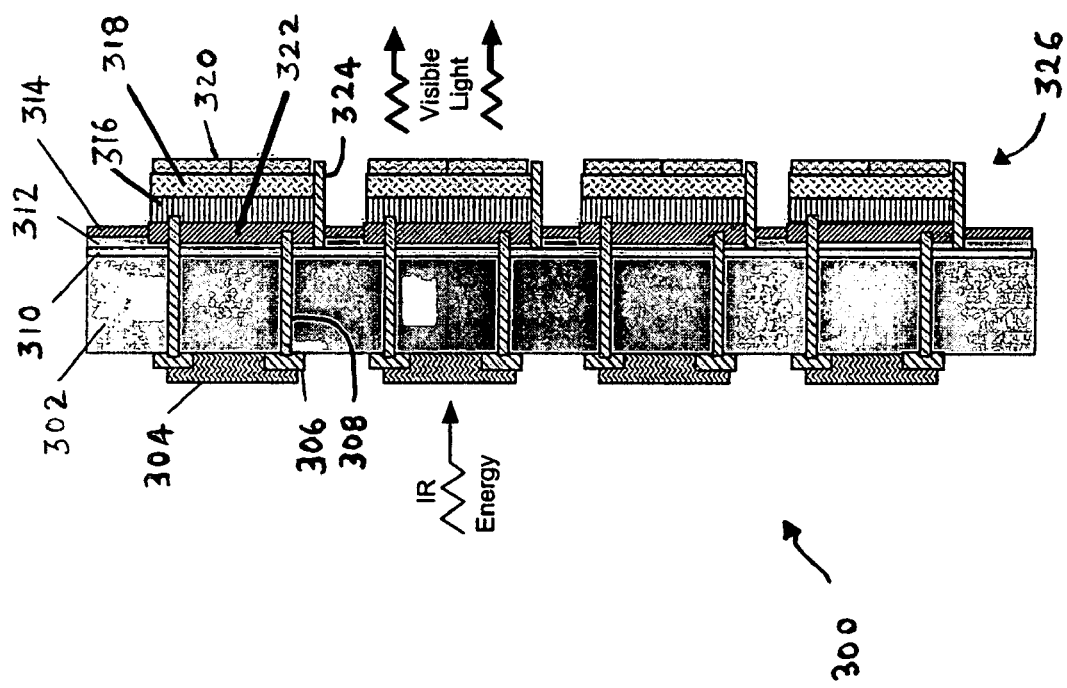
FIG. 3A is a block diagram schematically illustrating a side view of an infrared detector in accordance with another embodiment of the present invention.
Figure 3B:
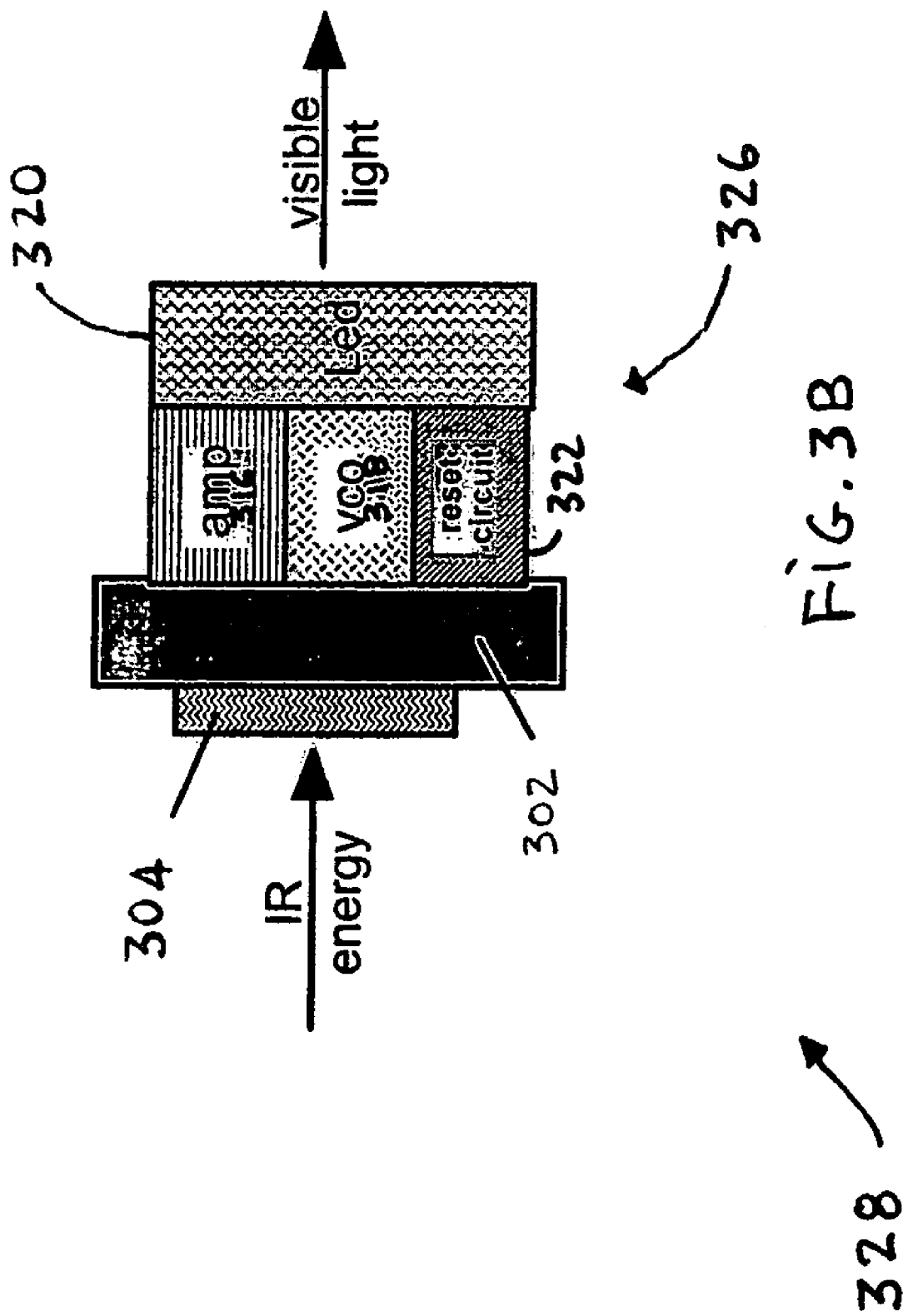
FIG. 3B is a block diagram schematically illustrating a side view of one infrared element of the detector shown in FIG. 3A.
Figure 3C:
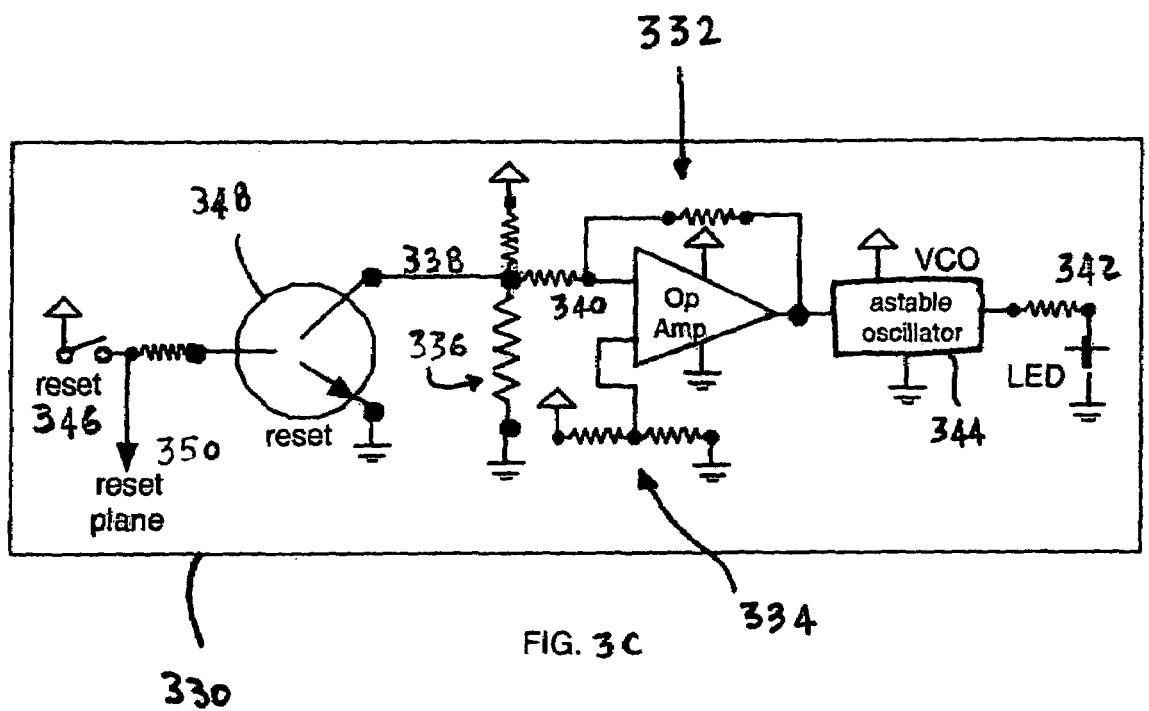
FIG. 3C is a circuit diagram schematically illustrating the electrical circuit of the infrared detector shown in FIG. 3A.

Detector and Readout Using Voltage Controlled Oscillator (VCO) LED Driver (FIGS. 3A, 3B, 3C)

FIG. 3A shows a block diagram of an IR detector device 300 with a voltage controlled oscillator (VCO) added. In this diagram, the IR energy from IR photons enter from left to right and strike the surface of the detector 304 on the front. The vias 308 go thru the substrate 302 connecting the detector 304 to the circuitry 326 at the rear of the substrate 302. The circuitry 326 at the rear includes a ground layer 310 on top of the substrate 302, an insulation layer 312 on top of the ground layer 310, a reset plane 314 and a reset circuit 322 on top of the insulation layer 312, an amplifying circuit 316 on top of the reset switch 322, a voltage controlled oscillator (VCO) 318 on top of the amplifying circuit 316, an LED 320 on top of the VCO 318. A vertical member 324 supports the circuitry 326. A detailed view of a single pixel detector is described in more detailed in FIG. 3B.

IR photons strike each detector 304 which measures the amount of incident photons. The detector 304 generates a corresponding variable analog signal such as a voltage in response to the amount of incident photons striking the detector 304. The amplifying circuit 316 varies the control voltage in response to the IR exposure of the detectors 304. In other words, the DC output level of the amplifying circuit 316 is proportional to the amount of IR exposure focused on the IR sensor material 304. The changing voltage output from the amplifying circuit 316 controls the modulation frequency and duty cycle of the VCO. So, the control voltage varies the frequency of the VCO 318 which varies the brightness of the LED 320 which produces visible light at the rear of the array 300. The modulation frequency of the VCO may be for example from 50 khz to 700 khz. The detector is isolated from the heat generated by the LED because of the insulative layer 312 of the substrate 302. Using the VCO, the LED may display at least 128 shades of gray between black and white with less power than operating the LED directly at 100% duty cycle. The IR material 304 can be piezo-pyroeletric material (PPM) or resistive.

FIG. 3B shows a cross-sectional view of a single element 328 of the detector system 300. The substrate 302 supports all the structures of the system. To reiterate operation from this view: the IR photons strike the detector 304 which produces a voltage corresponding to the amount of photons. This voltage is passed from the front detector 304 thru the substrate 302 to the rear circuitry 326 thru vias 308 to the amplifying circuit 316. The amplifying circuit 316 varies the control voltage based on the exposure of the IR detector 304. The control voltage varies to frequency of the VCO 318 which varies the brightness of the LED 320 which produces visible light at the rear of the array. A reset circuit 322 resets the voltage or resistance produced by the IR detector 304.

FIG. 3C illustrates an electrical circuit 330 embodying the circuitry 328. The Op-Amp 332 is biased on 334. As IR energy heats the IR sensor 336, the voltage on it increases 338. The Op-Amp 332 senses the input voltage 340 and meters a proportional amount of drive current to the LED 342. The amount of drive current is proportional to the level of IR energy heating the IR sensor 336. The more IR heating, the brighter the LED 342. In accordance with another embodiment, the amp 332 may vary the duty cycle or frequency of an Voltage Controlled Oscillator (VCO) 344. By changing a square waves duty cycle from 50% to wider periods, the brightness will decrease. The modulation frequency is from 50 khz to 700 khz. This will also use less power than a dc voltage (end). The detector 336 needs to be periodically cooled off or have the stored voltage 338 removed. If an optical chopper is used, it will physically block the IR energy from reaching the detector for some measured period of time. This will give the detector time to cool of and discharge its stored voltage 338.

Rather than using an optical chopper, the stored voltage 338 can be removed from the detector 336 by saturating the transistor 332. Closing the reset switch 346 turns on the transistors control gate 348 and saturates the transistor 332. This will give a direct path to ground for the stored voltage. Reducing the charge to zero is equal to a dark period.

After being reset, the detector 336 can build up its charge 338 again based on the amount of IR energy present at that time. If the IR energy striking the detector 336 is the same as the previous one, the detector 336 will charge to the same voltage and the LED (D) will display the same brightness. If the detected IR energy is different, the LED will display with an updated light level.

All the pixels in the array have a reset transistor 348. There is a reset plane 350 that connects all the reset transistors control gates 348 to a common point 350 that will reset all the pixels detectors 338 simultaneously.

Figure 4B:
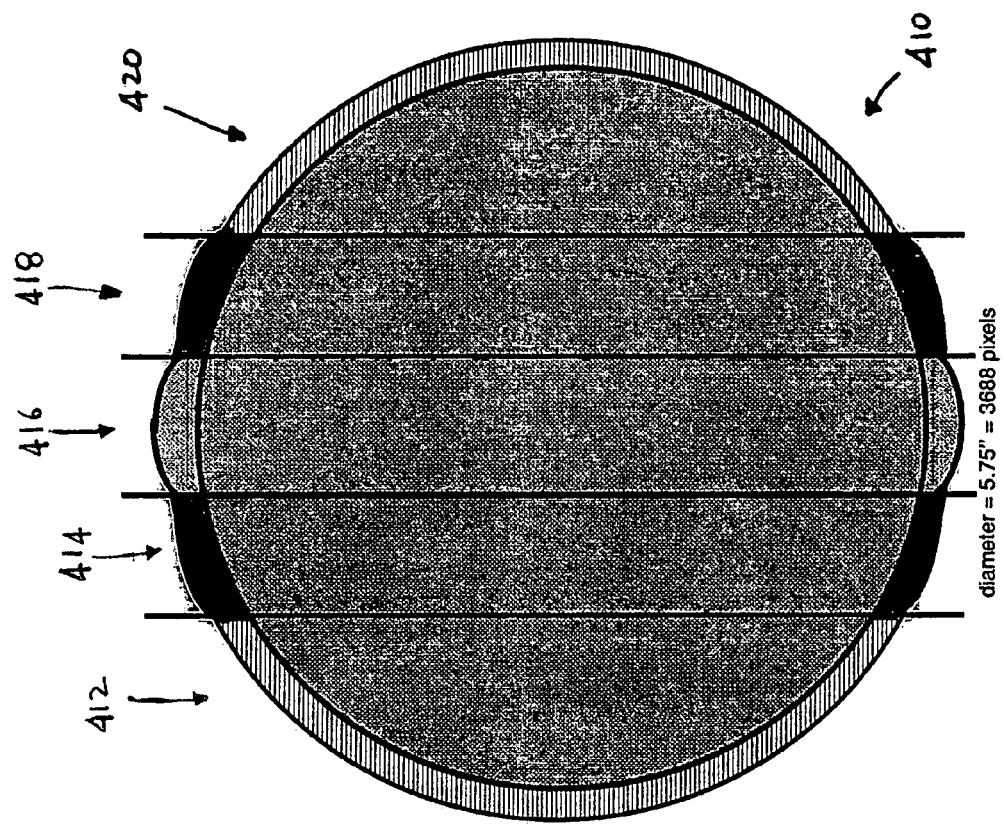
FIG. 4B is a diagram schematically illustrating sections of another wafer used in the production of an infrared detector in accordance with one embodiment of the present invention.
Figure 4A:
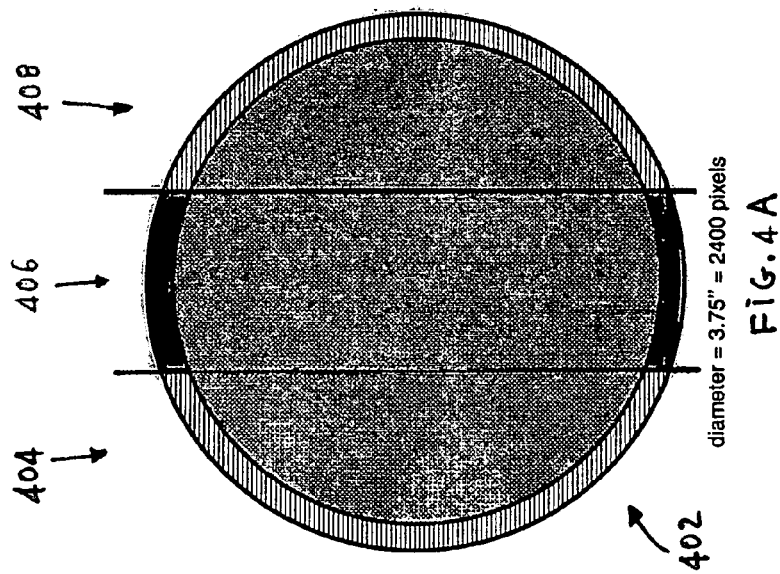
FIG. 4A is a diagram schematically illustrating sections of a wafer used in the production of an infrared detector in accordance with one embodiment of the present invention.

High Resolution Whole Wafer Imager and Power Division System (FIGS. 4A, 4B)

High end imaging like medical, scientific, pharmaceutical, military and aerospace requires very high resolution. That means using a high density of pixels to display more detailed and complex data. The present devices unique design lends itself very well to this type of imager. The same viewing techniques can be used with the high-density version as with the VGA format. The imager can be viewed directly on the rear from the devices LED array image, or a high resolution video camera can be aimed at the rear readout to get a real time video image that is viewable on an appropriate monitor. It can then be recorded in the conventional manner.

With respect to FIG. 4A, a whole 4" wafer 402 is used as one contiguous imager yielding a useful pixel area diameter of 3.75" which is equivalent to a total of 4.5 million pixels to use as an imager. The wafer 402 is divided into three power plane sections 404, 406, and 408, so the edge connections will not have to carry heavy currents. The maximum current for the whole device is almost 9 Amps. So the maximum current per section termination is 3 Amps.

With respect to FIG. 4B, a whole 6" wafer 410 is used as one contiguous imager yielding a useful pixel area diameter of 5.75" which is equivalent to a total of 10.7 million pixels to use as an imager. The wafer 410 is divided into five power plane sections 412, 414, 416, 418, and 420, so the edge connections will not have to carry heavy currents. The maximum current for the whole device is almost 20 Amps. So the maximum current per section termination is 4 Amps.

Figure 5:
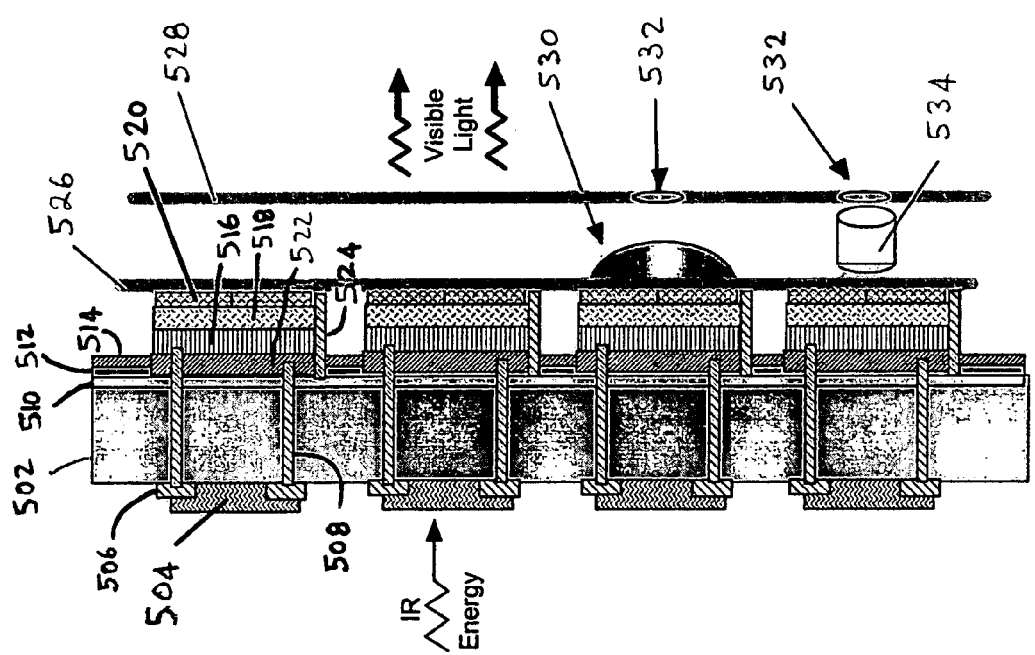
FIG. 5 is a diagram schematically illustrating a side view of an infrared detector with focusing means in accordance with one embodiment of the present invention.

Focusing the Readout Image and Protecting the LED's (FIG. 5)

FIG. 5 illustrates an alternative embodiment of the present invention. The IR energy from IR photons enter from left to right and strike the surface of the detector 504 on the front. The vias 508 go thru the substrate 502 connecting the detector 504 to the circuitry at the rear of the substrate 302. The circuitry at the rear includes a ground layer 510 on top of the substrate 502, an insulation layer 512 on top of the ground layer 510, a reset plane 514 and a reset circuit 522 on top of the insulation layer 512, an amplifying circuit 516 on top of the reset switch 522, a voltage controlled oscillator (VCO) 518 on top of the amplifying circuit 516, an LED 520 on top of the VCO 518. A vertical member 524 supports the circuitry.

Clear coating 526 protects the LED's 520 from moisture and contamination. A polarized translucent sheet 528 on which an image is formed like a camera ground glass is disposed behind the clear coating 526. The polarized sheet 528 may help direct the LED light straight out. This may negate the need for a lens 530. The lens 530 is used to direct the light from the LED 520 and focus it on a video camera or a translucent viewing sheet 528. A hollow tube 534 may be used to direct the light from the LED 520 at a video camera or a translucent viewing sheet 528. The lens 530 or tube 534 may be used to focus the LED light into a clear image dot 532 that is displayed on the translucent sheet 528.

Methods of Viewing the Readout Image (FIGS. 6A, 6B, 6C)

With respect to FIG. 6A (Direct View Image), the IR image is processed in the manner as previously described in this document up to where it is projected by the LED array 602. An IR lens 604 focuses the IR photons onto an IR detector 606. The IR detector 606 is deposited on a face of a substrate 608. A circuitry 610 is disposed on the back of the substrate 608. The LED array 602 is disposed on top of the circuitry 610. The light from the LED array 602 is projected on a readout screen 612.

The image is reversed by the lens 604 on the front of the detectors and appears oriented upside down on the LED array 602. A projection lens 614 then reverses the image again so it is oriented properly for direct viewing off the final image display screen 616 by the user.

With respect to FIG. 6B (Phosphor Readout Screen), the output readout LEDs screen 602 can be used to excite a phosphor coating 620 on a plastic or glass screen 612. The persistence of the screen can be varied as needed with phosphor type. The screen 612 would be an amorphous monochrome coating type. This would allow the LEDs to be pulsed and the image would persist in the phosphor. The glass or plastic screen would have to be hermetically sealed 618 to protect the phosphors from deterioration from atmospheric conditions like moisture, dirt etc.

With respect to FIG. 6C (Video Signal System), the IR image is processed in the manner as previously described in this document up to where it is projected by the LED array 602. The lens 604 turns the image upside down. It appears so on the display screen 616. To compensate for this simply, the video camera 622 is oriented upside down. In this way, the video picture appears with the proper orientation on the TV screen 624 or video tape or anywhere the video signal is sent.

Figures 7A, 7B:
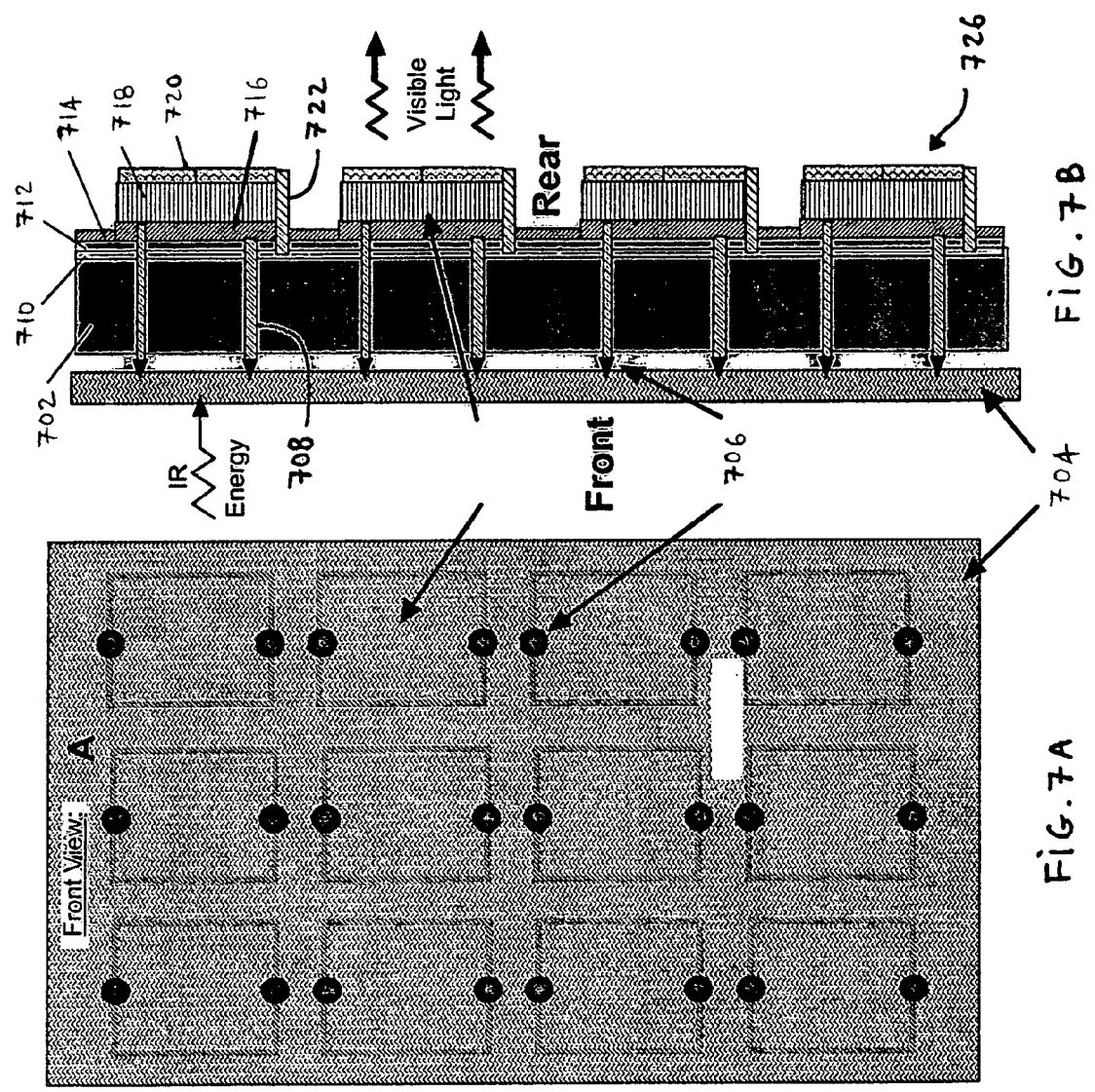
FIG. 7A is a diagram schematically illustrating a front view of an infrared detector with amorphous disc or sheet of IR sensitive material in accordance with another embodiment of the present invention.
FIG. 7B is a diagram schematically illustrating a side view of the infrared detector with amorphous disc or sheet of IR sensitive material shown in FIG. 7A.
Figure 7C:
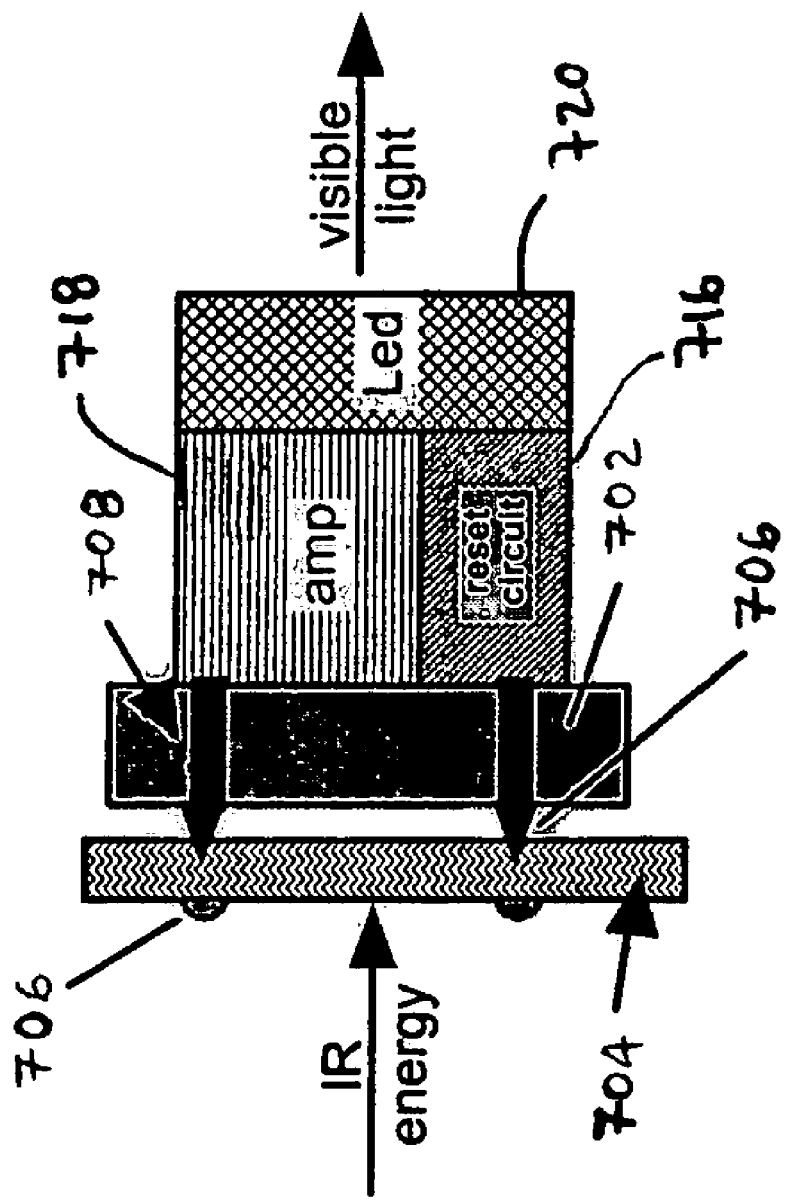
FIG. 7C is a block diagram schematically illustrating one infrared element of the detector with amorphous disc or sheet of IR sensitive material in accordance with another embodiment of the present invention.

Amorphous Disc or Sheet Detector Material (FIGS. 7A, 7B, 7C)

In accordance with another embodiment of the present invention, with respect to FIGS. 7A, 7B, and 7C, the individual detectors can be substituted by an amorphous planar disc or sheet of IR sensitive material 704 that changes resistance relative to exposure to incident IR radiation. There are polymers that have this capability. The individual pixel circuitry 726 needs to be modified with two probe points 706 that will stick up from the substrate 702. The disc or sheet 704 may be pressed onto the points 706 on the substrate 702 to make contact. The outer surface of the substrate may be of a non-conductive material so it will not short out the detector sheet or disc.

The remainder of the circuitry 726 will be the same or similar to what is used for the original embodiment of an individual detector for each pixel. The vias 708 travel thru the substrate 702 connecting the detector 704 to the circuitry 726 at the rear of the substrate 702. The circuitry 726 at the rear includes a ground layer 710 deposited on top of the substrate 702, an insulation layer 712 on top of the ground layer 110, a reset plane 714 and reset switch 716 on top of the insulation layer 712, an amplifying circuit 718 on top of the reset switch 716, and an LED 720 on top of the amplifying circuit 718. A vertical member 722 supports the circuitry 726 on the back of the substrate 702. A side-view of an element or pixel is described in more detailed in FIG. 7C.

With respect to FIG. 7C, the sheet detector material 704 includes dimples 706 on the IR receiving surface corresponding to the contact points 706. The sheet 704 is connected to the circuitry 726 on the back of the substrate 702 through the vias 708. The circuitry 726 includes at least an amp circuit 718, a reset circuit 716, and an LED 720.

Figures 8A, 8B:
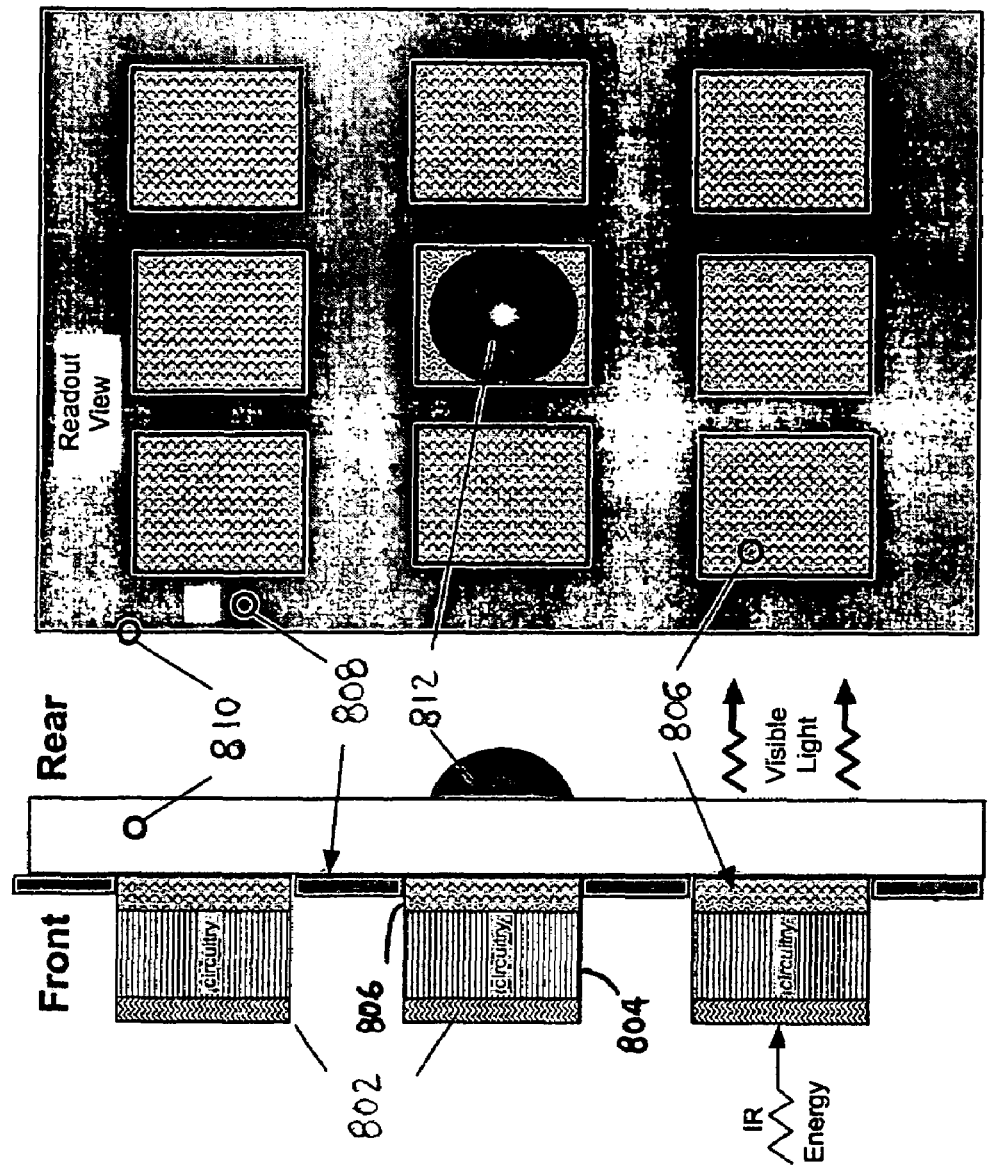
FIG. 8A is a diagram schematically illustrating a side view of an infrared detector in accordance with another embodiment of the present invention.
FIG. 8B is a diagram schematically illustrating a rear view of the infrared detector shown in FIG. 8A.

Circuitry Constructed on One Side of Transparent Glass Substrate (FIGS. 8A, 8B, 8C)

In accordance with another embodiment of the present invention, in FIGS. 8A and 8B, all the circuitry 804 may be placed on one side of the substrate 810. This eliminates the need for holes and vias in the substrate 810 to connect the detector 802 to the circuitry 804 as previously illustrated. The substrate 810 may be made of glass. This allows the light from the LEDs 806 to be viewed from the rear readout side of the glass substrate 810 in the opposite direction of the detector 802. All the device layers may be deposited on one side of the glass substrate 810. The detector 802 and circuitry 804 operate in the same manner as previously described in the other embodiments. A mask material 808 may be disposed between the open areas between the pixels. This mask blocks light from the rear readout side of the device from getting to the detector side. This mask also enhances contrast. A lens 812 may be placed on the rear side of the substrate 810 for each LED.

FIG. 8C illustrates a cross-section of a one-pixel detector. The circuitry 804 may include an amp circuit 814 and a reset circuit 816.

Manufacturing Techniques

The devices are manufactured using MEMS technology and foundry techniques starting out with a 4" or 6" wafer substrate. The wafer is divided into the appropriate shape for as many complete imagers as will fit on the wafer. Holes with pads and via feed thrus are placed for each pixel. The Piezo Pyro material is coated on the front of the wafer. On the back of the wafer, there are layers for ground plane, insulation, semiconductor layers, interconnects and light emitting materials. These layers are etched, laser cut and screened using MEMS techniques to produce the following schematic equivalent for each pixel and array on the wafer.

CCD and CMOS Visible Light Imager (FIGS. 9A, 9B)

Making electrical attachment to an existing visible light imagers photosensitive pixel area facilitates input of a control voltage that will simulate the imagers normal operation. A CCD or CMOS Visible Light Imager under normal operation collects photons at its pixels photosensitive photo semiconductor surface which causes it to gate a proportional number of electrons into the pixels capacitive quantum well. The collected electrons in the quantum well are the charge on the wells capacitance. This charge is measured and amplified by the imagers circuitry and eventually all the pixels measurements are used by the μC to create a video image signal.

If an electrical attachment is made to the light sensitive portion of a visible light imagers pixel 902 photo semiconductor, current can be injected there that will gate electrons into the quantum well much the same as if it was being exposed to varying levels of visible light. From that point, the imager can create a video image using its circuitry the same way it normally does. The imager will create a video image based on the voltage inputs to the individual pixels rather than exposure to light.

Overlays of devices like bolometers, thermistors and semiconductor detectors of any wavelength can be electrically attached to photosensitive semiconductor 902 to create the control voltage to simulate the imagers being exposed to visible light that is being varied from white thru grayscale to black. Overlays of various wavelength detectors can be electrically attached to the front-end photosensitive photo semiconductor 902 of mass-produced visible light imagers. These layers may include a detector layer 918, a detector circuitry 916, a power bus 920, and an insulating layer 912 having a contact pass-thru hole 914. The detector layer 902 may be connected to the other layers through busses and contacts 904.

This will take advantage of the low cost economy of scale and the quality of the imagers and the rich assortment of array sizes and output protocols available. It will take advantage of the imagers ROIC (Read Out Integrated Circuit) backbone of complex mux-switching, data control, buffering, amplification, memory and timing circuitry that inputs the μC and video circuitry that creates the video signal.

The present process using MEMS technology to deposit the necessary layers of materials to create the detectors and associated circuitry (video circuitry 908 on substrate 906) may be used to accomplish this. It is also possible to do this using standard silicon and CMOS foundry techniques. By attaching to the imagers photo semiconductor, the need to build the ROIC portion is eliminated with all the associated circuitry (mux, busses, switching, amps, μC) and software needed to make a backbone system to accommodate detectors of various types. To make an IR imager, an IR sensitive pixel just needs to be interfaced with the photo semiconductor and design simple interface circuitry to simulate the imagers normal operation from the new detectors output.

Dual Thermistor Voltage Divider (FIGS. 10A, 10B, 10C, 11A, 11B, 11C)

A thermistor can be used to detect IR Energy. Connecting PTC and NTC type thermistors in the following manner will double the networks gain and improve signal to noise ratio, versus using them individually or in a conventional series thermistor/resistor mode.

Connecting a NTC device 1014 to V+ 1022 gives a response curve that decreases impedance as exposure increases (see graph in FIG. 11A). Connecting a PTC device 1016 to ground 1024 or V− will give a response curve that increases impedance as exposure increases (see graph in FIG. 11B). When used as a voltage divider, these inverse reactions will yield twice the voltage change than if a single thermistor and fixed resistors were used.

Where the NTC and PTC devices 1014, 1016 connect together at connection 1012, a stripe of conductive material 1010 is deposited to aid in making a good connection between the devices and to facilitate their connection through the hole 1004 in the insulative coating 1002 and connection to the photo semiconductor 1008 below. A patch of resistor 1006 material optionally can be added here if voltage or impedance control is indicated. Control of the imagers pixel can also be done by optically coupling to the photodiode with an LED 1026 deposited over the pixel sensor.

By alternating NTC 1014 and PTC 1016 devices, alternating supply busses 1018 and 1020 can be conveniently placed between the pixels. The source voltage can be interrupted to reset the pixel voltage and grounded to zero all the pixels.

Figure 10A:
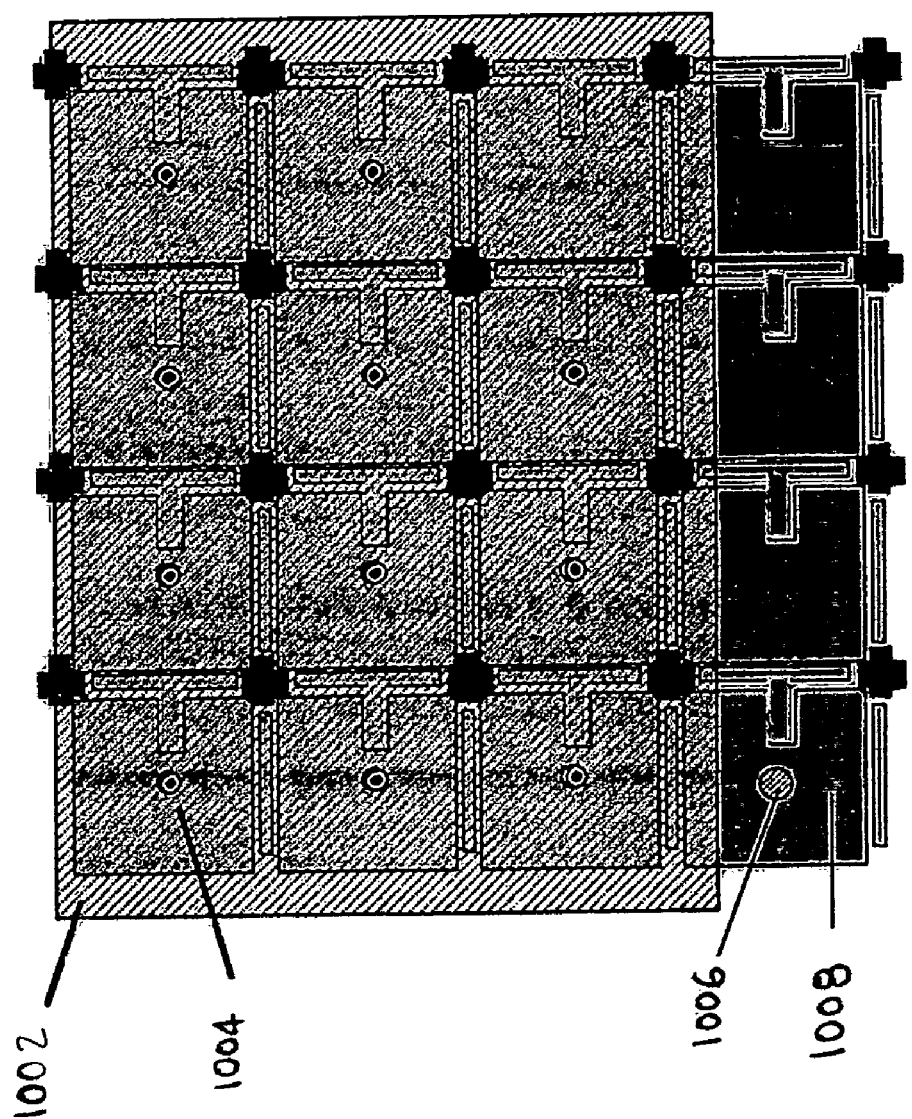
FIG. 10A is a diagram illustrating a front view of an infrared detector having a thermistor in accordance with another embodiment of the present invention.
Figure 10C:
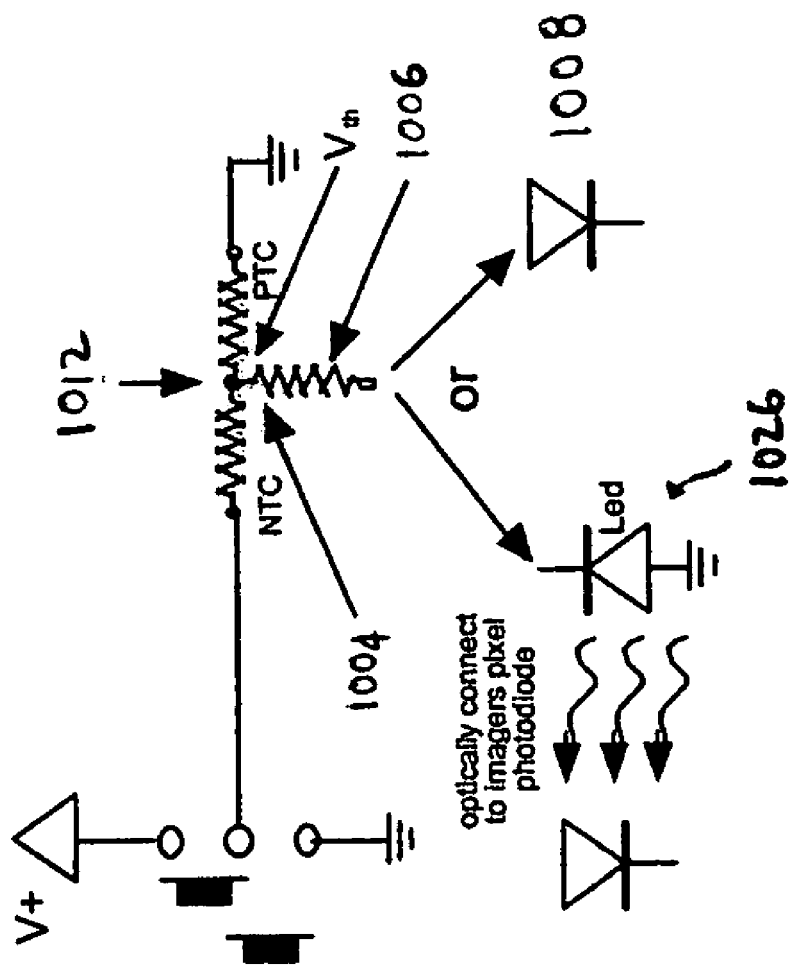
FIG. 10C is a diagram illustrating an electrical circuit of the cell shown in FIG. 10B.

FIG. 10C is an electrical circuit diagram illustrating an example of a circuit embodying the above description.

FIG. 11C is a table summarizing the relationship between the impedance of both NTC and PCT devices with respect to IR exposure.

Figure 12A:
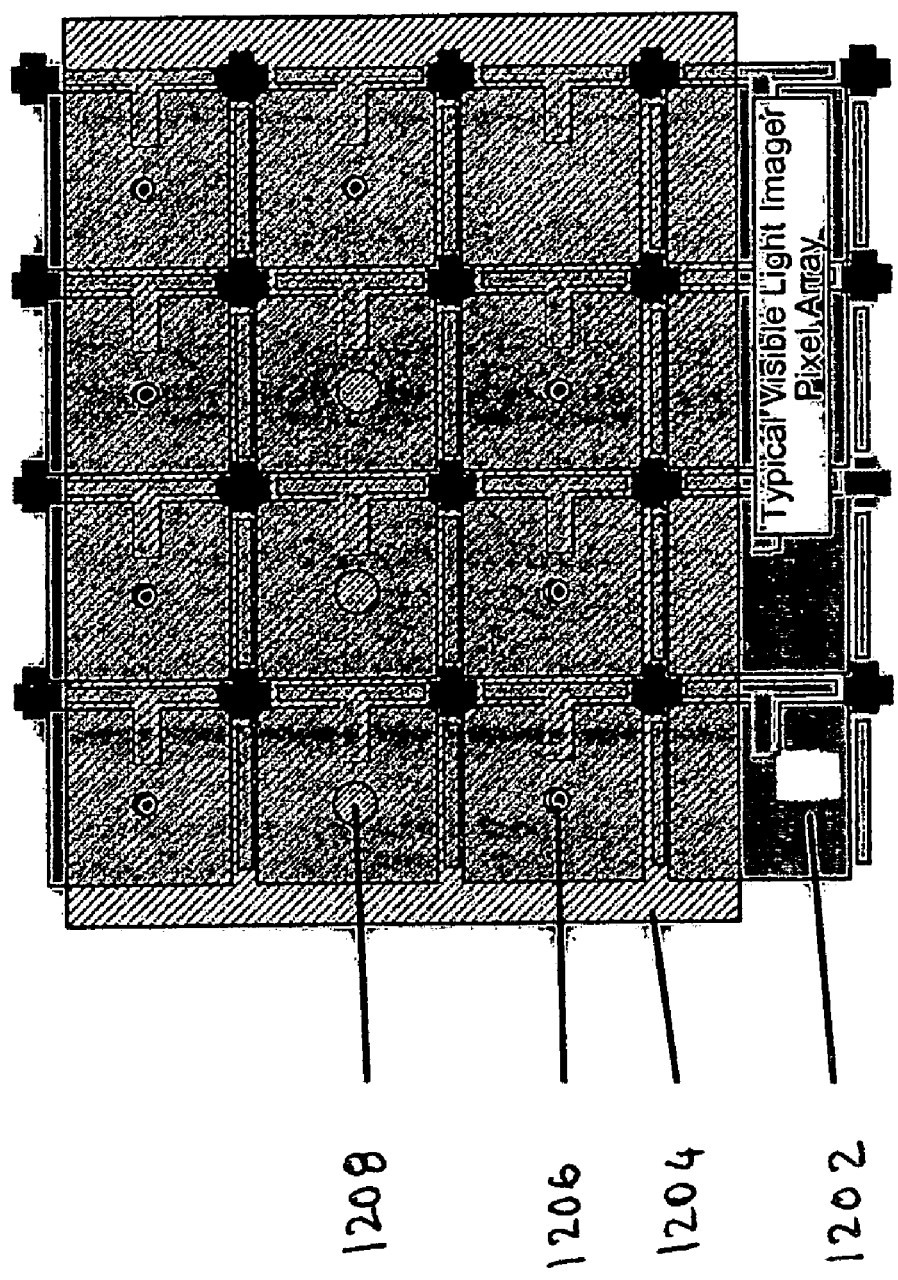
FIG. 12A is a diagram illustrating a front view of an infrared detector having a thermistor and power bus in accordance with another embodiment of the present invention.
Figure 12B:
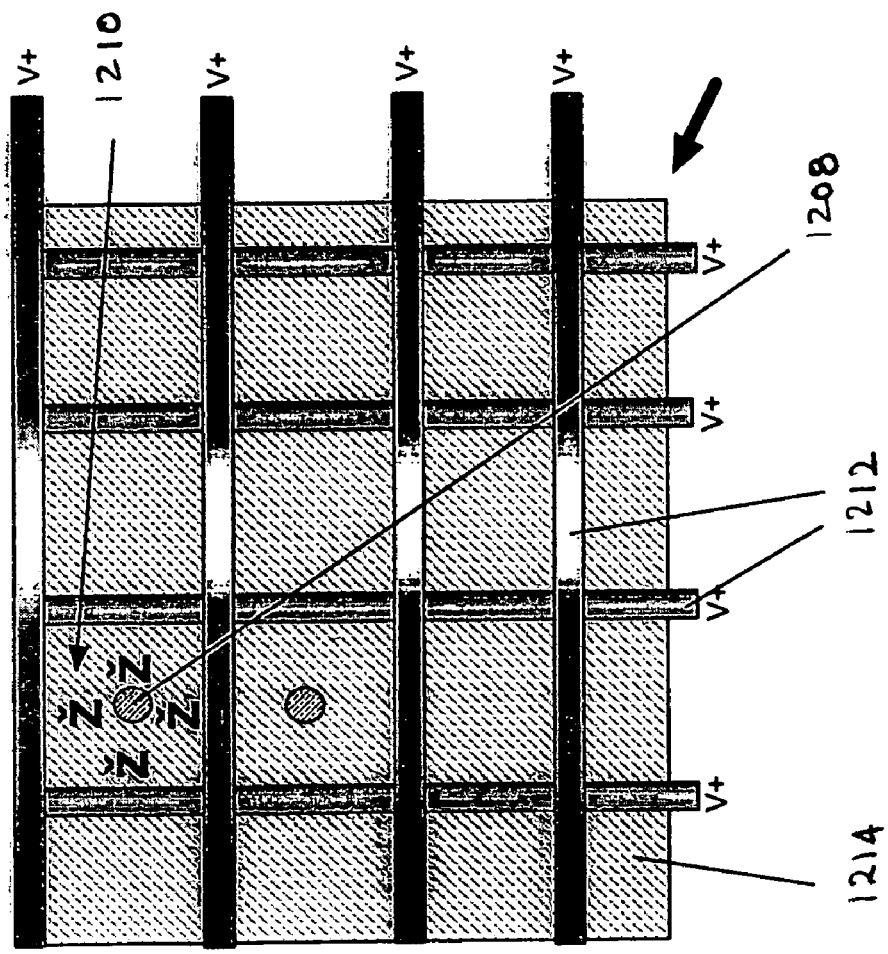
FIG. 12B is a diagram illustrating a resistive layer with power busses from the infrared detector of FIG. 12A.
Figure 12C:
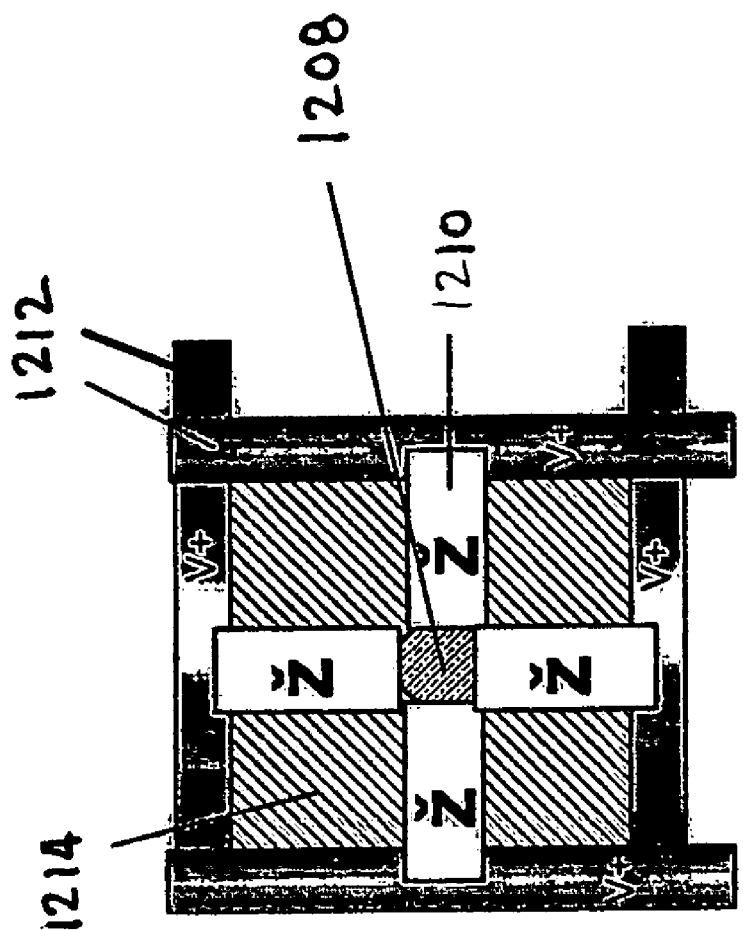
FIG. 12C is a diagram illustrating a cell of the resistive layer of FIG. 12A.

Amorphous Resistive Layer Forms Balanced Network Detectors with Simple Power Bus Overlay (FIGS. 12A, 12B, 12C)

The Ω resistive material is IR sensitive and varies impedance with exposure to incident IR energy. It is an amorphous layer 1214 that sits on top of the insulation layer 1204. The insulation layer 1204 sits on top of the imager pixels 1202. Holes 1206 are fabricated in the insulation layer 1204 over the center of each pixel. A contact pad 1208 is deposited over the hole 1206 in the insulation layer 1204 to make the electrical connection from each networks output to the pixels 1202 photo semiconductor. Power busses (V+) 1212 are laid on top of the resistive layer 1214 in a cross hatch and form a four-resistor 1210 balanced network at each pixel with the center contact 1208 being the voltage output for each pixels network. Current travels from the resistive layers 1214 positively biased networks thru the contact pad 1208 to each pixels photo semiconductor and then thru the imagers circuitry to ground. The Ω material and the V+ bus are biased so as to be able to vary the voltage going to the photo semiconductor. As the IR energy varies, the voltage going into the photo semiconductor varies, simulating light to dark exposure and voltage.

LED Deposited on Top of Imagers Pixel to Control Operation of Pixel (FIGS. 13a, 13B, 13C)

An LED 1304 from an IR detector array 1302 may be used to input photon energy onto the photosensitive semiconductor of a visible light imagers pixel 1306. The Led 1304 is used to drive the imager pixel 1306 output from black to white depending on the Led's light level. The imager pixel 1306 is from an array of imager pixel 1310. The Led's light level is designed to swing between black and white exposure for the pixel 1306. The Led 1304 is operated by applying a control voltage which is created by the exposure of the detector 1308 to the energy spectrum it is sensitive to. The detector circuit is designed to have a voltage swing that provides a proportional Led light level to the amount of spectral energy on the detector 1308.

With respect to FIG. 13B, placing the Led 1304 over the visible light pixel 1308 will provide the light to drive the pixel 1308 from black to white. By placing the Led 1304 in the corner of the detector limits thermal heat soak contact. By modulating the Led 1308 and only turning it on while the pixel needs to read exposure, heat soaking can be limited.

In accordance with another embodiment, FIG. 13C illustrates an IR detector pixel may be built using a dual thermistor voltage divider 1312 as previously described.

Figure 14:
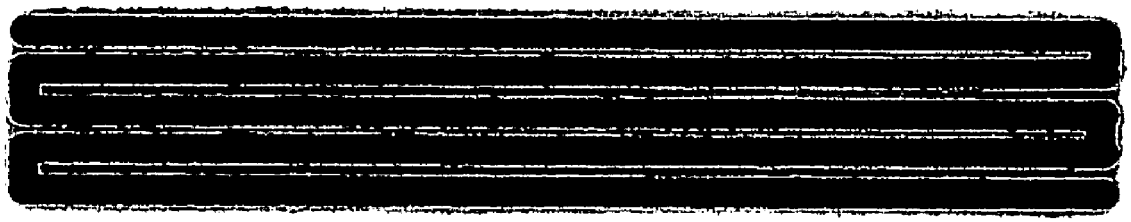
FIG. 14 is a diagram illustrating a layout of a deposit on a substrate.

Fill Factor (FIG. 14)

Most chemistries that can be deposited on semiconductor wafers and CMOS circuitry have relatively low impedance, on the order of 10 kΩ or less per rated area or length. In order to achieve high impedance using these materials, it is necessary to deposit them in long lengths. When using these materials for pixels in an imager, they must be folded or patterned in a serpentine format and stay within the confines of the pixels layout space.

The machinery that makes semiconductor wafer circuitry has various limitations. Semiconductor wafer design systems have a group of parameters called Design Rules. One of these rules is the space required between objects that are electrically conductive. If they are too close together, the process machinery may create short circuits that would negatively effect the operation and performance of the device.

Parallel lines of a continuous serpentine format need to be spaced at least as far apart as the design rule being used allows. If the design rule is 1 micron spacing, then the adjacent lines must be at least 1 micron apart or they may short together and destroy the device.

It is desirable in an imager to use all the space available to each pixel for detector material. The larger the collection area, the more energy the detector can absorb. The area available is one of the limiting factors of the pixels sensitivity. This is called Fill Factor.

FIG. 14 shows an example of a device with a design rule of 1 micron using material lines 2 microns thick to get a length that will provide the desired impedance. As illustrated, in each repetitive section, if the line is 2 microns and the space is 1 micron, the maximum fill factor is 66%.

A layout that can approach 100% is the design goal. The best way to do this is to devise a layout that can place material between the lines without causing short circuits or violating the design rules.

Figure 15A:
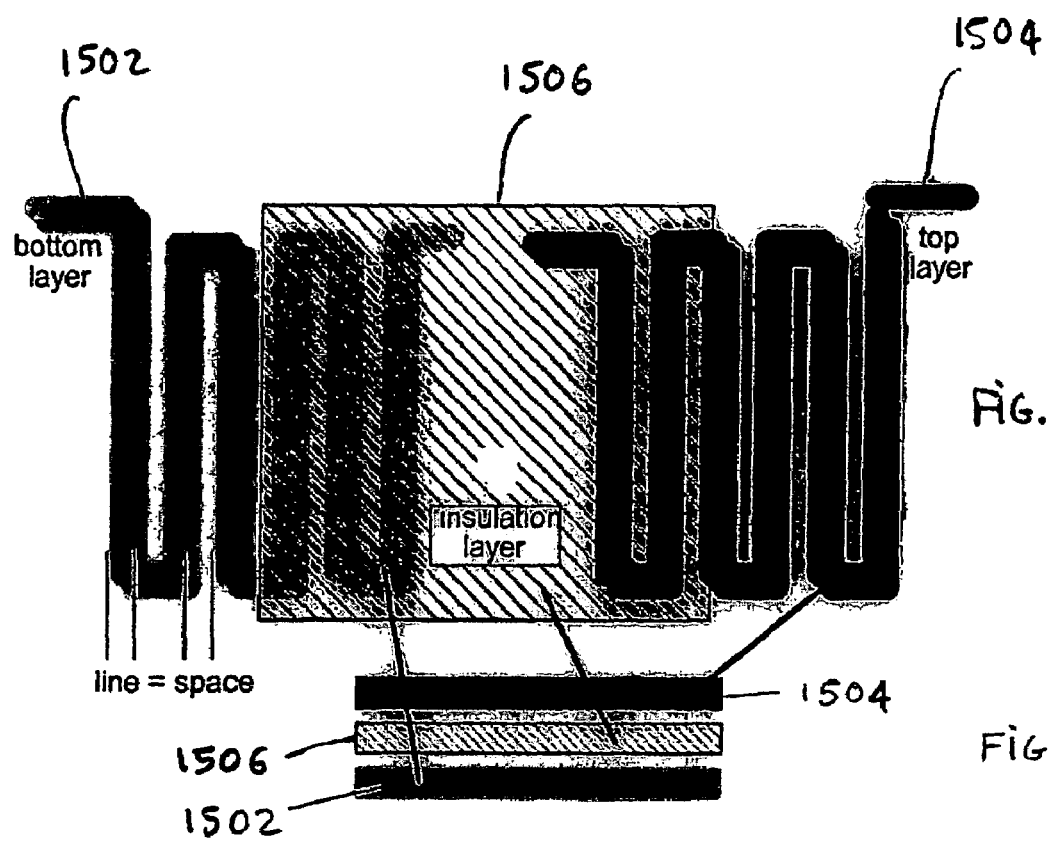
FIG. 15A is a diagram illustrating a top view of a deposition of material on a detector in accordance with one embodiment of the invention.
Figure 15B:
FIG. 15B is a diagram illustrating a side view of the deposition of material as shown in FIG. 15A.
Figure 15C:
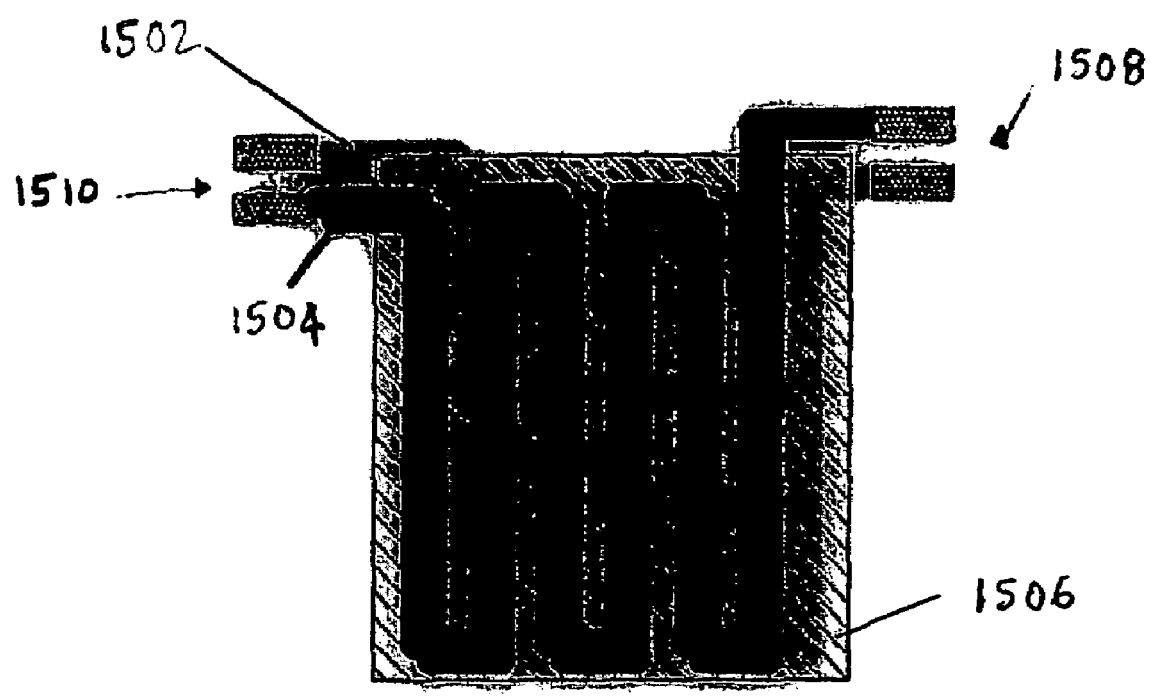
FIG. 15C is a diagram illustrating a top view of a completed deposition of material on a detector in accordance with one embodiment of the present invention.

Fill Factor Solution (FIGS. 15A, 15B, 15C)

In order to achieve maximum Fill Factor and usable surface area, the spaces between the lines must be capable of containing detector material. To accomplish this a 2 layer system with an insulation layer in between them will be implemented. The insulation layer will allow placing lines effectively closer than the design rules allow.

On the bottom layer 1502, a serpentine format is deposited using even dimensions of line and space. A layer of electrical insulation material 1506 that is transparent to the wavelength of energy that the detector is designed to react to is deposited over the bottom layer 1502 completely covering it (stripes that effectively cover the lines of the bottom layer are an alternative). A dimensional equivalent layout 1504 of the bottom layer 1502 is placed on top of the insulation layer 1506 in such a way as to have the lines overlay in the spaces of the bottom layer (FIG. 2).

The bottom 1502 and top 1504 layers may be electrically connected at points 1510 or 1508 to facilitate series or parallel circuits. Other circuitry may be connected at these points to achieve many configurations and control functions.

Figures 16A, 16B, 16C:
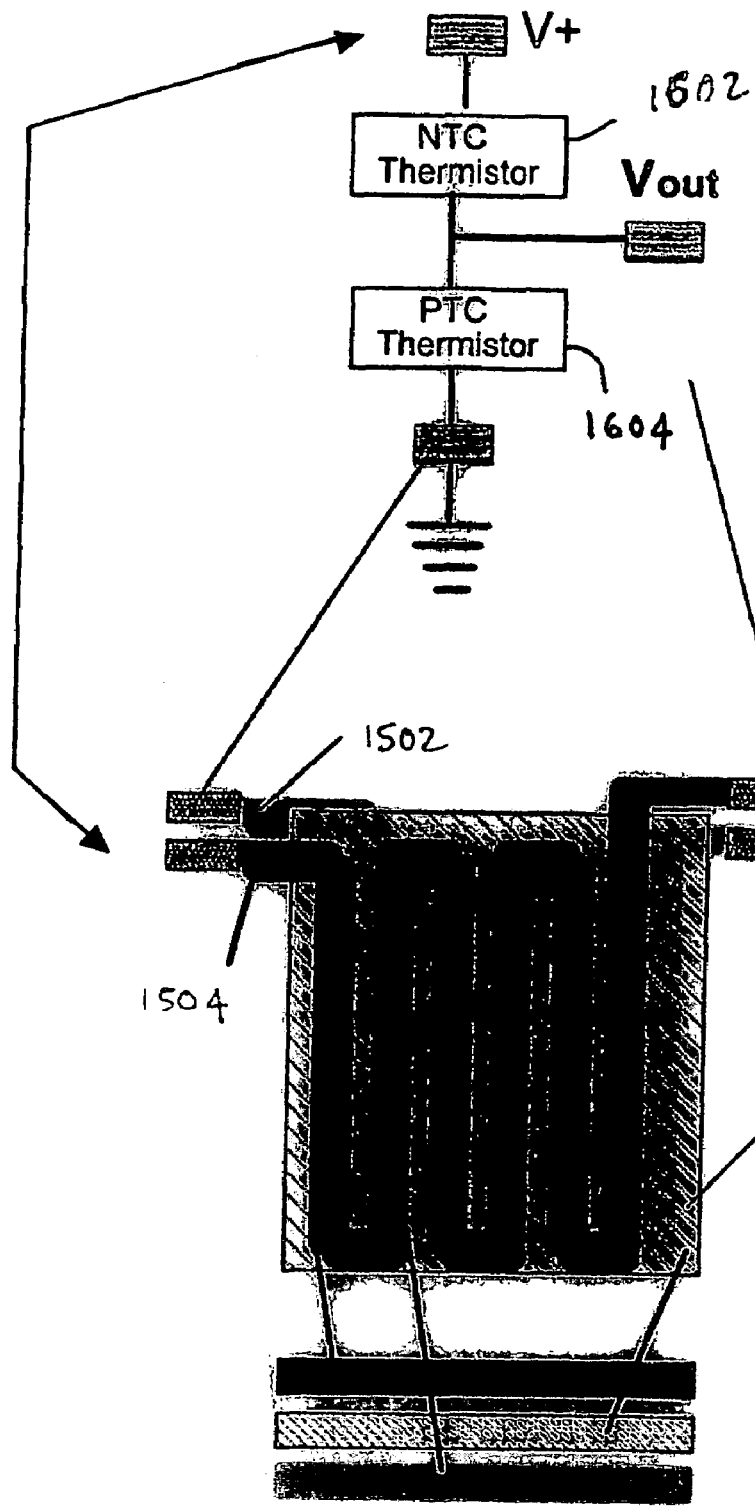
FIG. 16A is a diagram illustrating an electrical circuit representative of the completed deposition of material in accordance with one embodiment of the present invention.
FIG. 16B is a diagram illustrating a top view of the completed deposition of FIG. 16A.
FIG. 16C is a diagram illustrating a side view of the deposition layers of FIG. 16B.

Dual-Δ Thermistor Voltage Divider Network (FIGS. 16A, 16B, 16C)

In this adaptation of the fill factor solution, a Dual Delta-Δ voltage divider network is employed. This type of network can be configured to take advantage of the serpentine fill factor layout. Using this configuration as a microbolometer is new. In this configuration, the system operates the same as it does in FIG. 10B.

A thermistor (or microbolometer) can be used to detect IR Energy. Connecting PTC (positive temperature coefficient) 1602 and (B) NTC (negative temperature coefficient) 1604 type thermistors in the following manner will double the networks gain and improve signal to noise ratio, versus using them individually or in a conventional series thermistor/resistor mode.

Connecting a NTC 1602 device to V+ gives a response curve that decreases impedance as exposure increases. Connecting a PTC 1604 device to ground or V− will give a response curve that increases impedance as exposure increases. When used as a voltage divider, these inverse reactions will yield twice the voltage change than if a single thermistor and a fixed resistor were used.

Where the NTC and PTC devices 1602 and 1604 connect together, a stripe of conductive material 1606 may be deposited to aid in making a good connection.

ADVANTAGES

Many levels of complication and manufacturing difficulties have been eliminated by this innovative design. The image forms directly on the back of the array. Competitive devices require active video μC systems to create a viewable image. Consequently, no vertical or horizontal signal bus is needed to get the pixel signal to a Micro-controller (μC). No μC, no software, no control registers, no bus switches, no amp switches, no amp arrays, no calibration offset compensation, no adjacent bus line noise compensation are needed. No bus ghosting or adjacent line noise is created. No extra power is consumed by the above-mentioned sections of a μC based video system. No high speed or precise timing circuitry or video circuitry is needed.

By removing the active video portion of the design keeps the unit simple and low cost. If active video is needed, at can be added to the readout portion of the device with the addition of an inexpensive visible light board chip or standard camera. It can be an accessory to existing visible light systems to give them thermal vision.

The whole array can be reset at the same time. This capability can be used as a variable frame rate. It can be varied from zero to 120 frames per second (fps). At zero fps the detector can stare indefinitely to provide the equivalent of very high sensitivity to find weak and distant objects. Higher frame rates will minimize the video trails and smearing of moving objects. This also allows a screen refresh rate appropriate with the scenario being viewed. i.e.: 15 to 30 fps for most applications like surveillance, search and rescue, firematic, security etc. Faster rates for moving objects like cars, planes etc.

This system has similar features to conventional film cameras, in that the variable frame rate is similar to a cameras shutter preferred mode. A variable iris lens would give it an aperture-preferred mode. This gives the user control over depth of field and the ability to view moving objects better.

The video circuitry and associated bus systems would be very difficult and expensive to produce. It will cost less to add a visible light camera at the units readout than to design and build it into the device.

This device is manufactured using MEMS technology and techniques. The devices innovative design along with MEMS manufacturing allows for precision devices, uniformity between pixel elements within an array and uniformity between complete arrays on the same wafer. MEMS will also permit high yields per wafer and reduced manufacturing complexity which will result in very low cost products.

The low cost potential of this design will allow proliferation on a large scale to all the emergency services, law enforcement, security systems, military, aerospace, nautical, scientific research as well as medical uses, Homeland Security, automotive safety, machine vision, robotics, manufacturing, etc.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An infrared (IR) imaging device comprising:
    a planar substrate having a first face and a second face;
    a detector layer disposed adjacent to the first face of the planar substrate to receive incident IR radiation, wherein the detector layer is a contiguous layer formed of an amorphous IR sensitive material with a resistance that varies with exposure to incident IR radiation;
    a plurality of electrical circuits disposed on said second face of the planar substrate, wherein each electrical circuit is electrically coupled to an associated region the detector layer with conductive vias formed through the planar substrate, and wherein each electrical circuit operates to detect an amount of incident IR radiation exposure in the associated region of the detector layer by sensing an amount of change in resistance of the IR sensitive material within the associated region and generating an analog control signal with a level proportional to the detected amount of incident IR radiation in the associated region; and
    a plurality of light emitters each coupled to a corresponding one of the electrical circuits, wherein each light emitter is driven by an analog control signal output from its corresponding electrical circuit and configured to emit an amount of visible light in proportion to the level of the analog control signal.

2. The IR imaging device of claim 1 wherein each region of the detector layer associated with an electrical circuit corresponds to one pixel of a detector array formed by the contiguous layer of amorphous IR sensitive material.

3. The IR imaging device of claim 1 wherein the contiguous layer of amorphous IR sensitive material forms a focal plane array comprising an array of horizontal and vertical pixels.

4. The IR imaging device of claim 1 wherein said plurality of light emitters are configured to display varying shades between black and white.

5. The IR imaging device of claim 1 wherein said plurality of light emitters are configured to generate a real-time visible image.

6. The IR imaging device of claim 1 further comprising a video camera configured to generate a real time view of said plurality of light emitters.

7. The IR imaging device of claim 6 further comprising a translucent image display screen disposed between said video camera and said plurality of light emitters.

8. The IR imaging device of claim 1 further comprising a readout screen disposed on said plurality of light emitters.

9. The IR imaging device of claim 8 further comprising a phosphor coating disposed on a face of said readout screen between said readout screen and said plurality of light emitters.

10. The IR imaging device of claim 8 further comprising an optical lens optically coupled to said readout screen.

11. An IR imaging device comprising:
    a planar substrate having a first face and a second face;
    a video circuitry layer on said first face;
    a photosensitive semiconductor layer disposed on said video circuitry layer;
    an insulating layer having a contact pass-thru hole, said insulating layer deposited on said photosensitive semiconductor layer;
    a power bus layer deposited on said insulating layer;
    an IR detector circuitry layer deposited on said power bus; and
    an IR detector material layer deposited on said IR detector circuitry.

12. The IR imaging device of claim 11 wherein said IR detector comprises one or more thermistors.

13. The IR imaging device of claim 11 further comprising an LED deposited on top of said IR detector material layer.

14. The IR imaging device of claim 12 wherein said one or more thermistors include a PTC thermistor layer, an insulation layer deposited on top of said PTC thermistor layer, and a NTC thermistor layer deposited disposed on top of said insulation layer.

* * * * *